(12) United States Patent
Ohnuma

(10) Patent No.: US 6,909,117 B2
(45) Date of Patent: Jun. 21, 2005

(54) SEMICONDUCTOR DISPLAY DEVICE AND MANUFACTURING METHOD THEREOF

(75) Inventor: Hideto Ohnuma, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/386,257

(22) Filed: Mar. 11, 2003

(65) Prior Publication Data

US 2003/0155594 A1 Aug. 21, 2003

Related U.S. Application Data

(62) Division of application No. 09/957,915, filed on Sep. 21, 2001, now Pat. No. 6,562,671.

(30) Foreign Application Priority Data

Sep. 22, 2000 (JP) ........................................ 2000-289457

(51) Int. Cl.[7] .......................... H01L 29/04; H01L 31/036
(52) U.S. Cl. ............................. 257/72; 257/69; 257/204; 257/257; 257/291; 257/359
(58) Field of Search ................................ 257/291, 359, 257/72, 69, 204, 257

(56) References Cited

U.S. PATENT DOCUMENTS

| | | | |
|---|---|---|---|
| 4,907,048 A | 3/1990 | Huang | 357/23.9 |
| 4,963,504 A | 10/1990 | Huang | 437/44 |
| 5,055,899 A | 10/1991 | Wakai et al. | 357/23.7 |
| 5,100,820 A | 3/1992 | Tsubone | 437/44 |
| 5,108,935 A | 4/1992 | Rodder | |
| 5,182,619 A | 1/1993 | Pfiester | 257/382 |
| 5,241,203 A | 8/1993 | Hsu et al. | |
| 5,247,190 A | 9/1993 | Friend et al. | 257/40 |

(Continued)

FOREIGN PATENT DOCUMENTS

| | | |
|---|---|---|
| EP | 0 451 968 A1 | 10/1991 |
| EP | 0 522 991 | 1/1993 |

(Continued)

OTHER PUBLICATIONS

U.S. Appl. No. 09/724,387 (pending) to Inukai filed Nov. 28, 2000, including specification, claims, abstract, drawings and PTO filing receipt.

(Continued)

Primary Examiner—Amir Zarabian
Assistant Examiner—Ida M. Soward
(74) Attorney, Agent, or Firm—Cook, Alex, McFarron, Manzo, Cummings & Mehler, Ltd.

(57) ABSTRACT

A semiconductor display device which includes the polycrystalline silicon TFTs is constructed by a pixel region and a peripheral circuit and TFT characteristics required for each circuit are different. For example, an LDD structure TFT having a large off-current suppressing effect is suitable for the pixel region. Also, a GOLD structure TFT having a large hot carrier resistance is suitable for the peripheral circuit. When the performance of the semiconductor display device is improved, it is suitable that difference TFT structures are used for each circuit. In the case where the GOLD structure TFT having both Lov regions and Loff regions is formed, ion implantation into the Lov regions is independently performed using a negative resist pattern formed in a self alignment by a rear surface exposure method as a mask, and thus impurity concentrations of the Lov regions and the Loff regions can be independently controlled. Therefore, the GOLD structure TFT having both the hot carrier resistance and the off-current suppressing effect can be formed and the simplification of a manufacturing process of the semiconductor display device and the improvement of performance thereof are compatible with each other.

22 Claims, 16 Drawing Sheets

U.S. PATENT DOCUMENTS

| | | | |
|---|---|---|---|
| 5,323,042 A | 6/1994 | Matsumoto | 257/350 |
| 5,341,012 A | 8/1994 | Misawa et al. | 257/351 |
| 5,393,682 A | 2/1995 | Liu | 437/41 |
| 5,399,502 A | 3/1995 | Friend et al. | 437/1 |
| 5,412,240 A | 5/1995 | Inoue et al. | 257/347 |
| 5,482,871 A | 1/1996 | Pollack | 437/21 |
| 5,532,175 A | 7/1996 | Racanelli et al. | 437/29 |
| 5,534,716 A | 7/1996 | Takemura | 257/72 |
| 5,543,340 A | 8/1996 | Lee | 437/44 |
| 5,543,947 A | 8/1996 | Mase et al. | 359/84 |
| 5,567,966 A | 10/1996 | Hwang | 257/347 |
| 5,581,092 A | 12/1996 | Takemura | 257/65 |
| 5,583,067 A | 12/1996 | Sanchez | 437/44 |
| 5,585,295 A | 12/1996 | Wu | 437/44 |
| 5,594,569 A | 1/1997 | Konuma et al. | 349/122 |
| 5,608,251 A | 3/1997 | Konuma et al. | 257/337 |
| 5,627,084 A | 5/1997 | Yamazaki et al. | 437/21 |
| 5,637,519 A | 6/1997 | Tsai et al. | 438/160 |
| 5,643,826 A | 7/1997 | Ohtani et al. | 437/88 |
| 5,686,328 A | 11/1997 | Zhang et al. | 437/41 |
| 5,717,224 A | 2/1998 | Zhang | 257/57 |
| 5,744,822 A | 4/1998 | Takayama et al. | 257/66 |
| 5,757,444 A | 5/1998 | Takemura | 349/38 |
| 5,767,930 A | 6/1998 | Kobayashi et al. | 349/42 |
| 5,773,330 A | 6/1998 | Park | 438/164 |
| 5,821,622 A | 10/1998 | Tsuji et al. | 257/763 |
| 5,841,170 A | 11/1998 | Adan et al. | 257/345 |
| 5,851,861 A | 12/1998 | Suzawa et al. | 438/166 |
| 5,852,488 A | 12/1998 | Takemura | 349/187 |
| 5,858,867 A | 1/1999 | Hsia et al. | 438/592 |
| 5,903,249 A | 5/1999 | Koyama et al. | 345/92 |
| 5,923,961 A | 7/1999 | Shibuya et al. | 438/149 |
| 5,923,962 A | 7/1999 | Ohtani et al. | 438/150 |
| 5,982,348 A | 11/1999 | Nakajima et al. | 345/92 |
| 5,990,542 A | 11/1999 | Yamazaki | 257/642 |
| 5,994,721 A | 11/1999 | Zhong et al. | 257/89 |
| 6,011,274 A | 1/2000 | Gu et al. | 257/59 |
| 6,031,290 A | 2/2000 | Miyazaki et al. | 257/764 |
| 6,115,094 A * | 9/2000 | Fukunaga | 349/138 |
| 6,147,451 A | 11/2000 | Shibata et al. | |
| 6,153,445 A * | 11/2000 | Yamazaki et al. | 438/30 |
| 6,153,893 A | 11/2000 | Inoue et al. | 257/72 |
| 6,166,397 A | 12/2000 | Yamazaki et al. | 257/59 |
| 6,166,414 A * | 12/2000 | Miyazaki et al. | 257/369 |
| 6,198,133 B1 | 3/2001 | Yamazaki et al. | 257/347 |
| 6,211,536 B1 * | 4/2001 | Zhang | 257/72 |
| 6,238,754 B1 | 5/2001 | Shohara et al. | 428/1.5 |
| 6,259,138 B1 | 7/2001 | Ohtani et al. | 257/351 |
| 6,274,400 B1 | 8/2001 | Jen | 438/30 |
| 6,274,887 B1 * | 8/2001 | Yamazaki et al. | 257/72 |
| 6,277,679 B1 | 8/2001 | Ohtani | 438/151 |
| 6,281,552 B1 | 8/2001 | Kawasaki et al. | 257/350 |
| 6,284,577 B1 | 9/2001 | Suzawa et al. | 438/163 |
| 6,288,413 B1 | 9/2001 | Kamiura et al. | 257/66 |
| 6,303,963 B1 | 10/2001 | Ohtani et al. | 257/350 |
| 6,306,694 B1 | 10/2001 | Yamazaki et al. | 438/151 |
| 6,337,731 B1 | 1/2002 | Takemura | 349/187 |
| 6,346,718 B1 | 2/2002 | Yamanaka et al. | 257/79 |
| 6,346,730 B1 | 2/2002 | Kitakado et al. | 257/350 |
| 6,358,766 B1 | 3/2002 | Kasahara | 438/30 |
| 6,362,507 B1 | 3/2002 | Ogawa et al. | 257/350 |
| 6,365,917 B1 * | 4/2002 | Yamazaki | 257/72 |
| 6,384,808 B2 | 5/2002 | Azami | 345/100 |
| 6,392,628 B1 | 5/2002 | Yamazaki et al. | 345/98 |
| 6,399,988 B1 | 6/2002 | Yamazaki | 257/344 |
| 6,407,430 B1 | 6/2002 | Ohtani et al. | 257/350 |
| 6,420,200 B1 | 7/2002 | Yamazaki et al. | 438/30 |
| 6,462,802 B1 * | 10/2002 | Nishimura et al. | 349/147 |
| 6,469,317 B1 * | 10/2002 | Yamazaki et al. | 257/59 |
| 6,501,098 B2 | 12/2002 | Yamazaki | |
| 6,524,895 B2 * | 2/2003 | Yamazaki et al. | 438/149 |
| 6,573,195 B1 * | 6/2003 | Yamazaki et al. | 438/783 |
| 6,777,763 B1 * | 8/2004 | Zhang et al. | 257/408 |
| 2002/0021266 A1 | 2/2002 | Koyama et al. | 345/76 |
| 2002/0048829 A1 | 4/2002 | Yamazaki et al. | 438/16 |

FOREIGN PATENT DOCUMENTS

| | | |
|---|---|---|
| EP | 0 803 911 A2 | 10/1997 |
| EP | 0 886 319 | 12/1998 |
| JP | 4-369271 | 12/1992 |
| JP | 5-102483 | 4/1993 |
| JP | 6-037314 | 2/1994 |
| JP | 6-148685 | 5/1994 |
| JP | 7-071675 | 3/1995 |
| JP | 7-130652 | 5/1995 |
| JP | 7-202210 | 8/1995 |
| JP | 7-235680 | 9/1995 |
| JP | 8-051207 | 2/1996 |
| JP | 8-078329 | 3/1996 |
| JP | 8-096959 | 4/1996 |
| JP | 8-110530 | 4/1996 |
| JP | 8-146402 | 6/1996 |
| JP | 8-274336 | 10/1996 |
| JP | 9-063770 | 3/1997 |
| JP | 10-092576 | 4/1998 |
| JP | 10-135468 | 5/1998 |
| JP | 10-135469 | 5/1998 |
| JP | 10-144929 | 5/1998 |
| JP | 10-247735 | 9/1998 |
| JP | 11-338786 | 12/1999 |
| JP | 2000-223716 | 8/2000 |
| JP | 2000-236097 | 8/2000 |
| JP | 2000-243975 | 9/2000 |
| JP | 2001-343933 | 12/2001 |
| JP | 2002-006777 | 1/2002 |
| WO | WO 90/13148 | 11/1990 |

OTHER PUBLICATIONS

Tsutsui, T. et al, "Electroluminescence in Organic Thin Films," Photochemical Processes in Organized Molecular Systems, K. Honda, ed., Elsevier Science Publishers, pp. 437–450 (1991).

Hwang, J.M. et al, "Novel Polysilicon/Tin Stacked–Gate Structure for Fully Depleted SOI/CMOS," International Electron Devices Meeting (IDEM), New York, IEEE, pp. 345–348, (1992).

Hwang, J.M. et al, "High Performance Submicron SOI/CMOS with an Elevated Source/Drain Structure," Proceedings of the Annual SOS/SOI Technology Conference (1991), Silicon–On–Insulator Technology and Devices, New York, IEEE, vol. 19, pp. 132–133, Oct. 5, (1993).

Tanaka, T. et al, "Ultrafast Operation of Vth –Adjusted p+–n+ Double–Gate SOI Mosfet'," IEEE Electron Device Letters, vol. 15, No. 10, pp. 386–388, Oct. (1994).

Inui, S. et al, "Thresholdless Antiferroelectricity in Liquid Crystals and its Application to Displays," J. Matter Chem., vol. 6, No. 4, pp. 671–673, (1996).

Yoshida, T. et al, "A Full–Color Thresholdless Antiferroelectric LCD Exhibiting Wide Viewing Angle with Fast Response Time," SID 97 Digest, pp. 841–844, (1997).

Furue, H. et al, "Characteristics and Driving Scheme of Polymer–Stabilized Monostable FLCD Exhibiting Fast Response Time and High Contrast Ratio with Gray–Scale Capability," SID 98 Digest, pp. 782–785, (1998).

Choi, K.Y. et al, "Gate–Overlapped Lightly Doped Drain Poly–Si Thin–Film Transistors for Large Area–AMLCD," IEEE Transactions on Electron Devices, vol. 45, No. 6, pp. 1272–1279, Jun. (1998).

Baldo, M.A. et al, Highly Efficient Phosphorescent Emission from Organic Electroluminescent Devices Nature, vol. 395, pp. 151–154, Sep. 10, (1998).

Yoshihara, T., "Time Division Full Color LCD by Ferroelectric Liquid Crystal,"EKISHO, vol. 3, No. 3, pp. 190–194 (1999).

Terada, et al, "Half–V Switching Mode FLCD," Proceedings of the 46$^{th}$ Applied Physics Association Lectures, 28p–V–8, p. 1316, Mar. (1999).

Baldo, M.A. et al, "Very High Efficiency Green Organic Light–Emitting Devices Based on Electrophosphorescence," Applied Physics Letters, vol. 75, No. 1, pp. 4–6, Jul. 5, (1999).

Schenk, H. et al, "Polymers for Light Emitting Diodes," EuroDisplay '99: Proceedings of the 19$^{th}$ International Display Research Conference, Sep. 6–9, 1999, Berlin, Germany, pp. 33–37, (1999).

Tsutsui, T. et al, "High Quantum Efficiency in Organic Light–Emitting Devices with Iridium–Complex as a Triplet Emissive Center," Japanese Journal of Applied Physics, vol. 38, pp. L1502–L1504, Dec. 15, (1999).

U.S. Appl. No. 09/832,867 (pending) to Yamazaki et al filed Apr. 12, 2001, including specification, pending claims, abstract, drawings and PTO filing receipt.

Hatano, M. et al, "A Novel Self–Aligned Gate–Overlapped LDD Poly–Si TFT with High Reliability and Performance," IEDM 97 Technical Digest, pp. 523–526, 1997.

* cited by examiner

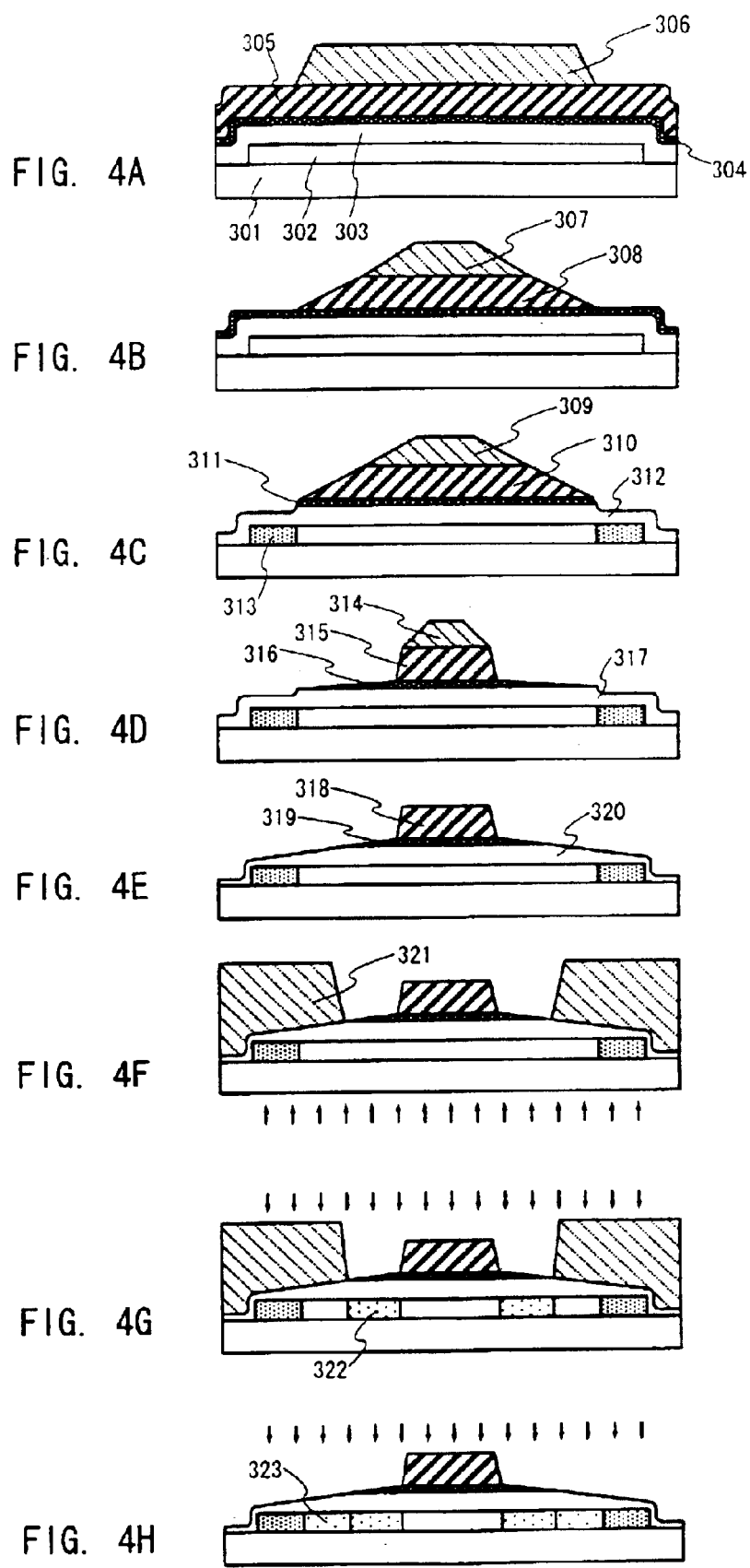

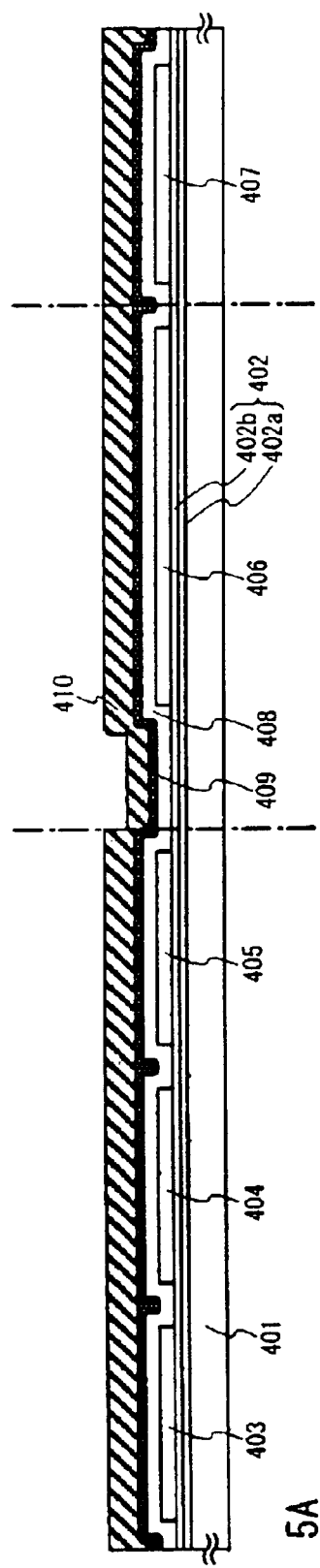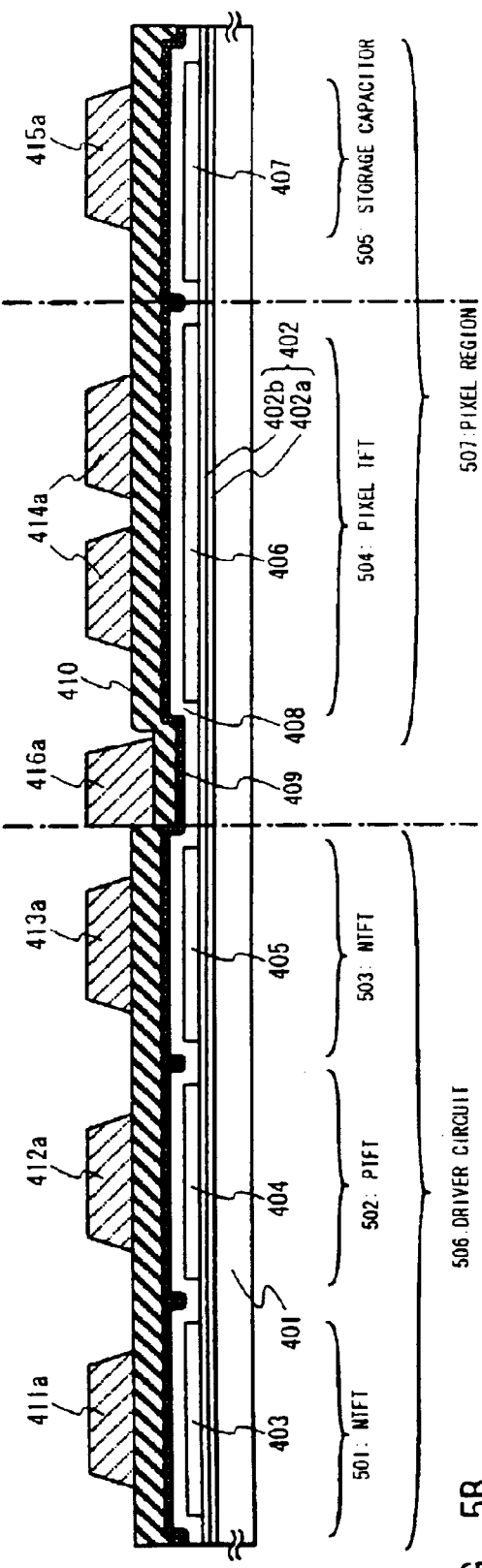

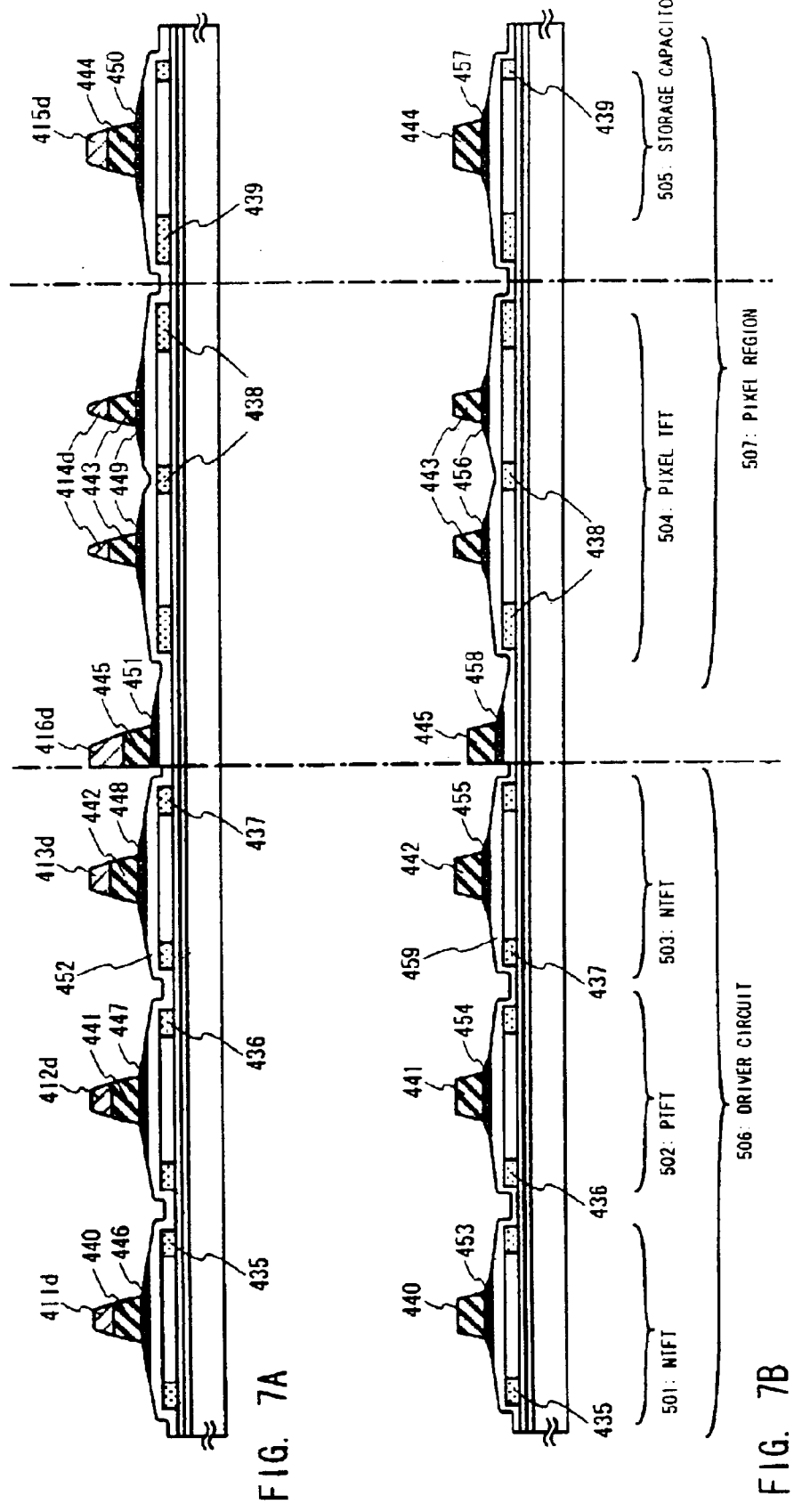

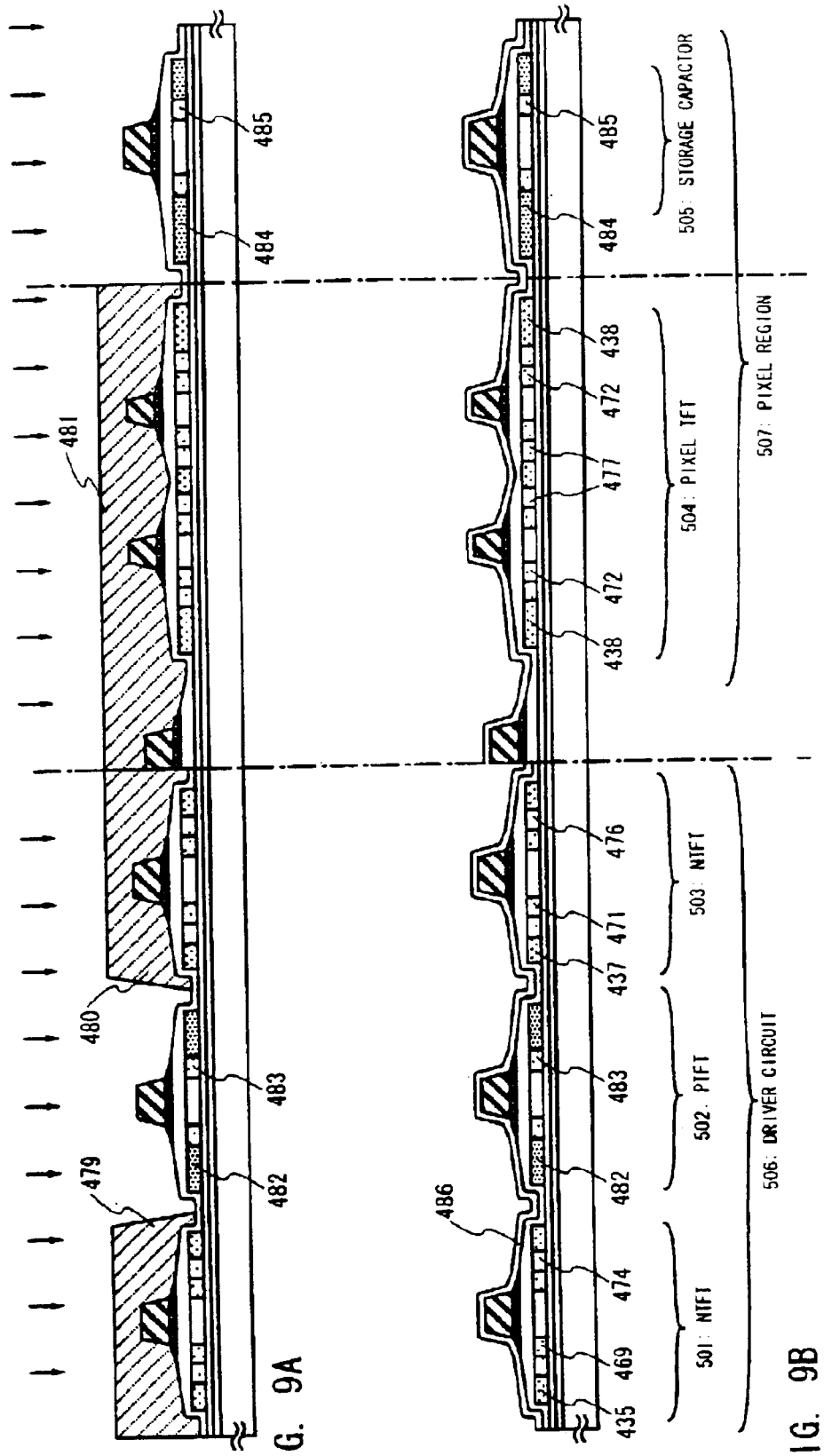

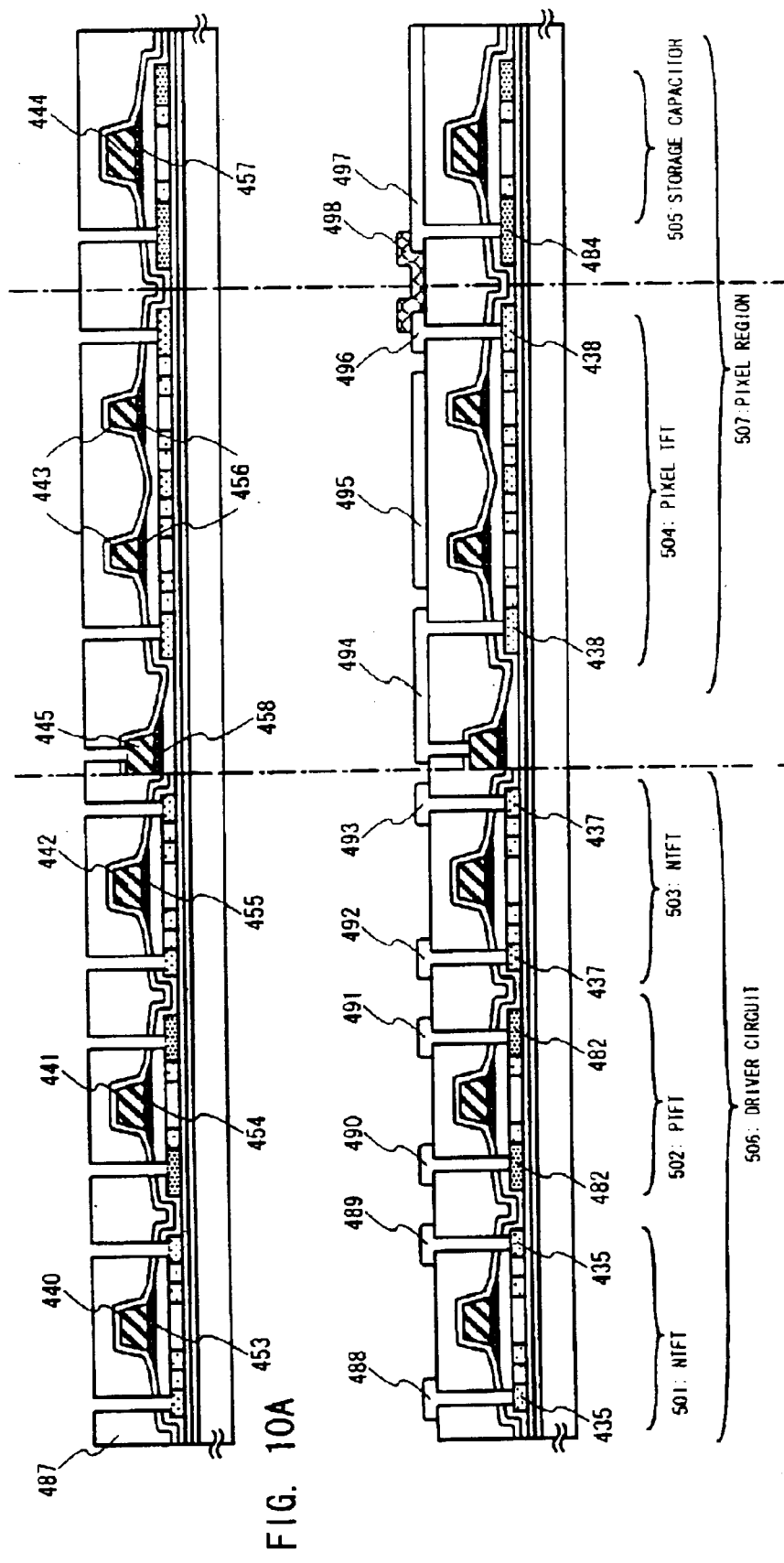

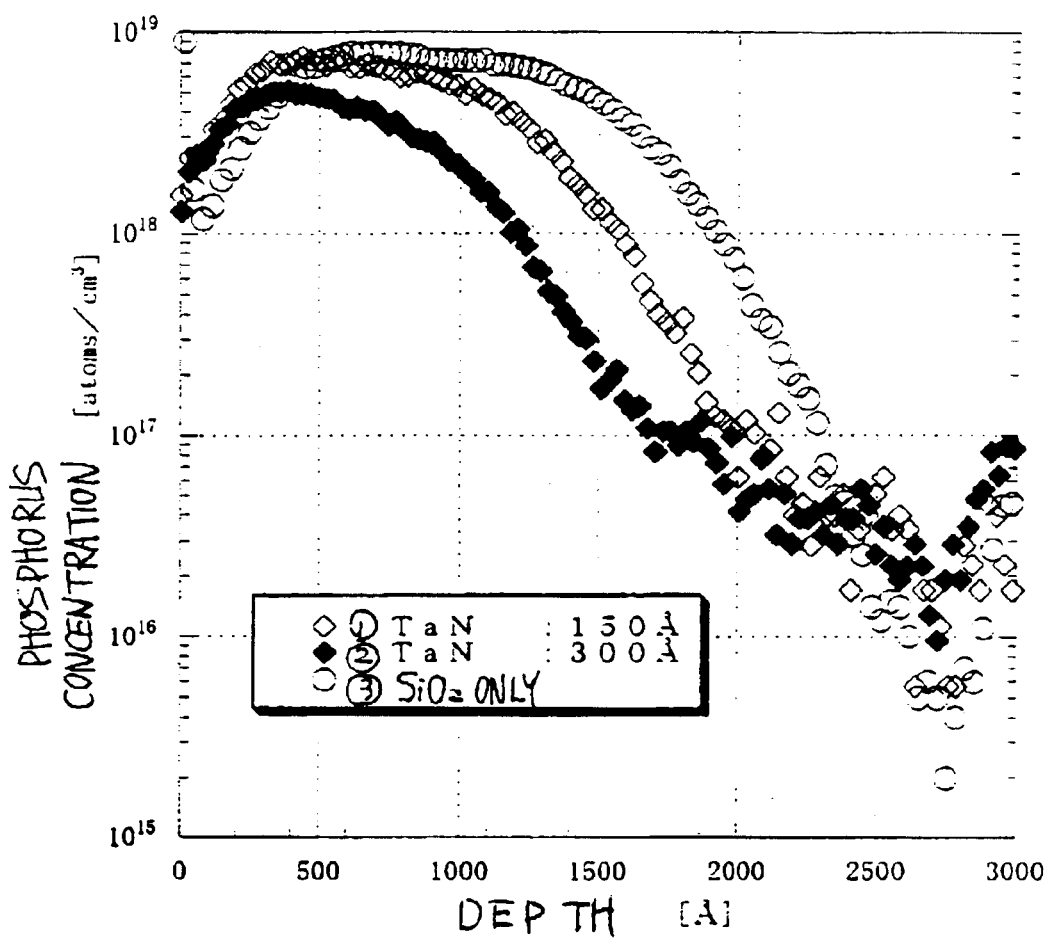
F I G. 16

SEMICONDUCTOR DISPLAY DEVICE AND MANUFACTURING METHOD THEREOF

This application is a divisional of U.S. application Ser. No. 09/957,915, filed on Sep. 21, 2001 now U.S. Pat. No. 6,562,671.

BACKGROUND OF THE INVENTION

1. Field of the Invention

The present invention relates to a semiconductor display device having a circuit comprising thin film transistors (hereinafter referred to as TFTs) and a manufacturing method thereof. As the semiconductor display device, there is an electro-optical device such as a liquid crystal display and an EL (electroluminescence) display, which comprises, for example, the TFTs.

2. Description of the Related Art

Recently, an active matrix liquid crystal display technique using the TFT is noted. An active matrix display is superior to a passive matrix display in a response speed, a view angle, and a contrast. Thus, this currently becomes the mainstream of a note type personal computer, a liquid crystal television, or the like.

The TFT is generally constructed using amorphous silicon or polycrystalline silicon for a channel layer. In particular, a polycrystalline silicon TFT manufactured in a low temperature process (generally, 600° C. or lower) has the following characteristics. That is, a low cost and a large area can be achieved. Simultaneously, since an electron or a hole has a high electric field mobility, when such a TFT is used for the liquid crystal display, not only the integration of pixel transistors but also the integration of drivers as a peripheral circuit can be achieved. Thus, the development is progressed in each liquid crystal display maker.

However, when the polycrystalline silicon TFT is continuously driven, there is the case where a deterioration phenomenon such as a reduction in a mobility or an on-current (current flowing in the case where the TFT is in an on-state) and an increase in an off-current (current flowing in the case where the TFT is in an off-state) is observed. This is a large problem in reliability. This phenomenon is called a hot carrier phenomenon and it is known that this is due to a hot carrier produced by a high electric filed near a drain.

This hot carrier phenomenon is a phenomenon discovered in a MOS transistor firstly. Thus, as hot carrier measures, various basic studies have been made until now. In the case of the MOS transistor with a design rule of 1.5 $\mu$m or less, as measures to the hot carrier phenomenon by a high electric field near the drain, an LDD (Lightly to Doped Drain) structure is employed. According to the LDD structure, low concentration impurity regions (n⁻ regions) are provided in drain end portions by using side walls in the sides of a gate and an impurity concentration of the drain junction is made gradient to relax an electric field concentration near the drain.

In the case of the LDD structure, a drain withstanding voltage is greatly improved relatively to a single drain structure. However, since the resistance of the low concentration impurity regions (n⁻ regions) is large, there is such a defect that a drain current is decreased. Also, high electric field regions are present immediately under the side walls, impact ionization is maximized in those regions, and hot electrons are injected into the side walls. Thus, a deterioration mode inherent to the LDD, such as the low concentration impurity regions (n⁻ regions) are depleted and the resistance is increased becomes a problem. As a channel length is shortened, the above problems are come to be apparent. Therefore, in the MOS transistor with 1.5 $\mu$m or less, as a structure for overcoming the problems, a GOLD (Gate-Overlapped LDD) structure in which the low concentration impurity regions (n⁻ regions) are formed by overlapping the end portions of a gate electrode with each other is designed and employed.

Under such a background, even in the case of the polycrystalline silicon TFT as a constitution element of the liquid crystal display, as in the case of the MOS transistor, an application of the LDD structure and the GOLD structure is studied for the purpose of relaxing a high electric field near the drain. In the case of the LDD structure, the low concentration impurity regions (n⁻ regions) and high concentration impurity regions (n+ regions) as a source region or a drain region outside the low concentration impurity regions are formed in a polycrystalline silicon layer corresponding to the outer regions of the gate electrode. Thus, although an effect for suppressing the off-current is large, there is such a defect that an effect for suppressing a hot carrier by relaxing the electric field near the drain is small. On the other hand, in the case of the GOLD structure, the low concentration impurity regions (n⁻ regions) of the LDD structure is formed to overlap with the end portions of the gate electrode and a hot carrier suppressing effect is larger than in the LDD structure. However, there is such a defect that the off-current becomes large.

Also, as an example for studying the GOLD structure in an n-channel polycrystalline silicon TFT, for example, there is "Mutuko Hatano, Hajime Akimoto and Takesi Sakai, IEDM97, TECHNICAL DIGEST. pp.523–526, 1997", in which a basic characteristic of the GOLD structural TFT is disclosed. In the basic structure of the GOLD structural TFT, the gate electrode and LDD side walls comprise polycrystalline silicon. Also, the low concentration impurity regions (n⁻ regions) as electric field relaxation regions and the high concentration impurity regions (n+ regions) as the source region or the drain region outside the low concentration impurity regions are formed in an active layer (comprising polycrystalline silicon) located immediately under the LDD side walls. With respect to the basic characteristic, compared with a general LDD structural TFT, a drain electric field is relaxed and a large drain current is obtained. Also, such a characteristic that an effect for suppressing a drain avalanche hot carrier is large is obtained.

A semiconductor display device such as the liquid crystal display device, which comprises the polycrystalline silicon TFTs is constructed by a pixel region and a peripheral circuit as a driver circuit and TFT characteristics required for each circuit are different. For example, an LDD structure polycrystalline silicon TFT having a large off-current suppressing effect is suitable for the pixel region. In addition, a GOLD structure polycrystalline silicon TFT having a large hot carrier resistance is suitable for the peripheral circuit as the driver circuit. When the performance of the semiconductor display device is improved, it is suitable that the pixel region comprises the LDD structure polycrystalline silicon TFTs and the peripheral circuit as the driver circuit comprises the GOLD structure polycrystalline silicon TFTs. However, since a manufacturing process is complicated, an increase in a manufacturing cost and a reduction in a yield become a large problem.

SUMMARY OF THE INVENTION

An object of the present invention is to provide a semiconductor display device capable of solving the above problems and a manufacturing method thereof.

According to the present invention, there is provided a semiconductor device comprising a plurality of thin film transistors formed on a transparent insulating substrate, each of said thin film transistors comprising: a semiconductor layer, a gate insulating film, and a gate electrode being laminated in order from a side near the transparent insulating substrate, and a source region and a drain region being formed in the semiconductor layer outside the gate electrode, wherein the gate electrode comprises a first layer gate electrode and a second layer gate electrode located on the first layer gate electrode and the first layer gate electrode is formed to have a longer size in a channel direction than the second layer gate electrode, wherein a first impurity region is formed in the semiconductor layer corresponding to an exposed region of the first layer gate electrode of the gate electrode, wherein a second impurity region and a third impurity region are formed adjacent to each other from a side near the gate electrode in the semiconductor layer corresponding to the outside of the gate electrode, and wherein an impurity concentration of the first impurity region is higher than that of the second impurity region and lower than that of the third impurity region.

In the semiconductor device, the first impurity region, the second impurity region, and the third impurity region are the same conductivity type impurity regions and have one of an n-type and a p-type as a conductivity type.

In the semiconductor device, the first layer gate electrode and the second layer gate electrode comprise different high melting metals.

In the semiconductor device, the first layer gate electrode comprises a TaN film as a compound containing high melting metal and the second layer gate electrode comprises a W film as the high melting metal.

In the semiconductor device, the semiconductor layer comprises one of a polycrystalline silicon film and a crystalline silicon film formed using a catalyst element.

An electronic equipment having the semiconductor device according to the present invention, wherein the electronic equipment is selected from the group consisting of a video camera, a digital camera, a rear type projector, a front type projector, a head mounted display, a goggle type display, a game machine, a car navigation system, a personal computer, a mobile computer, a mobile telephone, an electronic book, a personal computer, and a recording medium.

According to the present invention there is provided a semiconductor display device comprising a plurality of n-channel thin film transistors formed on a transparent insulating substrate, each of the n-channel thin film transistors comprising: a semiconductor layer, a gate insulating film, and a gate electrode being laminated in order from a side near the transparent insulating substrate, and a source region and a drain region being formed in the semiconductor layer outside the gate electrode, wherein the gate electrode comprises a first layer gate electrode and a second layer gate electrode located on the first layer gate electrode and the first layer gate electrode is formed to have a longer size in a channel direction than the second layer gate electrode, wherein a first impurity region is formed in the semiconductor layer corresponding to an exposed region of the first layer gate electrode of the gate electrode, wherein a second impurity region and a third impurity region are formed adjacent to each other from a side near the gate electrode in the semiconductor layer corresponding to the outside of the gate electrode, and wherein an impurity concentration of the first impurity region is higher than that of the second impurity region and lower than that of the third impurity region.

In the semiconductor device, the first impurity region, the second impurity region, and the third impurity region are n-type impurity regions.

In the semiconductor device, wherein an n-type impurity concentration of the first impurity region is $2 \times 10^{16}$ to $2.7 \times 10^{19}$ atoms/cm$^3$, preferably, about $1 \times 10^{17}$ to $5.3 \times 10^{18}$ atoms/cm$^3$.

In the semiconductor device, wherein an n-type impurity concentration of the second impurity region is $4.7 \times 10^{15}$ to $2.7 \times 10^{18}$ atoms/cm$^3$, preferably, about $4.7 \times 10^{17}$ to $5.3 \times 10^{17}$ atoms/cm$^3$.

In the semiconductor device, wherein an n-type impurity concentration of the third impurity region is about $3 \times 10^{18}$ to $5 \times 10^{21}$ atoms/cm$^3$, preferably, about $1.7 \times 10^{19}$ to $2.7 \times 10^{20}$ atoms/cm$^3$.

In the semiconductor device, wherein the first layer gate electrode and the second layer gate electrode comprise different high melting metals.

In the semiconductor device, wherein the first layer gate electrode comprises a TaN film as a compound containing high melting metal and the second layer gate electrode comprises a W film as the high melting metal.

In the semiconductor device, wherein the semiconductor layer comprises one of a polycrystalline silicon film and a crystalline silicon film formed using a catalyst element.

An electronic equipment having a semiconductor device according to the present invention, wherein the electronic equipment is selected from the group consisting of a video camera, a digital camera, a rear type projector, a front type projector, a head mounted display, a goggle type display, a game machine, a car navigation system, a personal computer, a mobile computer, a mobile telephone, an electronic book, a personal computer, and a recording medium.

According to the present invention, there is provided a method of manufacturing a semiconductor device comprising: laminating a semiconductor layer, a gate insulating film, a first layer gate electrode film, and a second layer gate electrode film over a transparent insulating substrate in order from a side near the transparent insulating substrate; forming a resist pattern for gate electrode formation over the substrate with the laminated structure; performing dry etching using the resist pattern as a mask to form a first shaped gate electrode comprising a first layer gate electrode and a second layer gate electrode; ion-implanting an impurity of one conductivity type to form a first impurity region in the semiconductor layer corresponding to an outside of the first shaped gate electrode; performing additional etching using the resist pattern present on the first shaped gate electrode as a mask to form a second shaped gate electrode in which the first layer gate electrode has a longer size in a channel direction than the second layer gate electrode; performing rear surface exposure using the first layer gate electrode of the second shaped gate electrode as a mask to form a negative resist pattern in a self alignment; ion-implanting an impurity of a conductivity type identical to the one conductivity type to form a second impurity region in the semiconductor layer corresponding to an exposed region of the first layer gate electrode of the second shaped gate electrode; removing the negative resist pattern; and ion-implanting an impurity of a conductivity type identical to the one conductivity type to form a third impurity region in the semiconductor layer corresponding to an outside of the second shaped gate electrode.

According to the present invention, a dose of the second impurity region is set to be lower than that of the first impurity region and higher than that of the third impurity region.

According to the present invention, the impurity is ion-implanted by an ion dope apparatus.

According to the present invention, respective impurity concentrations of the second impurity region and the third impurity region are independently controlled.

According to the present invention, different kinds of high melting metals or different compounds containing the high melting metals are applied to the first layer gate electrode film and the second layer gate electrode film.

According to the present invention, a TaN film as a compound containing high melting metal is applied to the first layer gate electrode film and a W film as the high melting metal is applied to the second layer gate electrode film.

According to the present invention, the semiconductor layer is formed with one of a polycrystalline silicon film and a crystalline silicon film formed using a catalyst element.

According to the present invention, the semiconductor device is included in an electronic equipment is selected from the group consisting of a video camera, a digital camera, a rear type projector, a front type projector, a head mounted display, a goggle type display, a game machine, a car navigation system, a personal computer, a mobile computer, a mobile telephone, an electronic book, a personal computer, and a recording medium.

According to the present invention, there is provided a method of manufacturing a semiconductor device comprising: forming a semiconductor layer, a gate insulating film, a first layer gate electrode film, and a second layer gate electrode film on a transparent insulating substrate in order from a side near the transparent insulating substrate; forming a resist pattern for gate electrode formation on the substrate with a resultant structure; performing dry etching using the resist pattern as a mask to form a first shaped gate electrode comprising a first layer gate electrode and a second layer gate electrode; ion-implanting an impurity of one conductivity type to form a first impurity region in the semiconductor layer corresponding to an outside of the first shaped gate electrode; performing additional etching using the resist pattern present on the first shaped gate electrode as a mask to form a second shaped gate electrode in which the first layer gate electrode has a longer size in a channel direction than the second layer gate electrode; ion-implanting an impurity of a conductivity type identical to the one conductivity type to form a second impurity region in the semiconductor layer corresponding to an outside of the second shaped gate electrode; performing rear surface exposure using the first layer gate electrode of the second shaped gate electrode as a mask to form a negative resist pattern in a self alignment; and ion-implanting an impurity of a conductivity type identical to the one conductivity type to form a third impurity region in the semiconductor layer corresponding to an exposed region of the first layer gate electrode of the second shaped gate electrode.

According to the present invention, a dose of the third impurity region is set to be lower than that of the first impurity region and higher than that of the second impurity region.

According to the present invention, the impurity is ion-implanted by an ion dope apparatus.

According to the present invention, respective impurity concentrations of the second impurity region and the third impurity region are independently controlled.

According to the present invention, different kinds of high melting metals or different compounds containing the high melting metals are applied to the first layer gate electrode film and the second layer gate electrode film.

According to the present invention, a TaN film as a compound containing high melting metal is applied to the first layer gate electrode film and a W film as the high melting metal is applied to the second layer gate electrode film.

According to the present invention, the semiconductor layer is formed with one of a polycrystalline silicon film and a crystalline silicon film formed using a catalyst element.

According to the present invention, the semiconductor device is included in an electronic equipment is selected from the group consisting of a video camera, a digital camera, a rear type projector, a front type projector, a head mounted display, a goggle type display, a game machine, a car navigation system, a personal computer, a mobile computer, a mobile telephone, an electronic book, a personal computer, and a recording medium.

According to the present invention, there is provided a method of manufacturing a semiconductor device comprising: forming a semiconductor layer over a substrate; forming a gate insulating film on the semiconductor layer; forming a gate electrode on the gate insulating film, the gate electrode comprising a first conductive layer and a second conductive layer formed on the first conductive layer; forming a negative resist over the substrate; performing rear surface exposure using the gate electrode as a mask to form a negative resist pattern in a self alignment; introducing an impurity into first impurity regions in the semiconductor using the second conductive layer and the negative resist pattern as masks; removing the negative resist pattern; and introducing the impurity into the first impurity regions and second impurity regions in the semiconductor layer using the second conductive layer as a mask.

According to the present invention, there is provided a method of manufacturing a semiconductor device comprising: forming a semiconductor layer over a substrate; forming a gate insulating film on the semiconductor layer; forming a gate electrode on the gate insulating film, the gate electrode comprising a first conductive layer and a second conductive layer formed on the first conductive layer; introducing an impurity into the first impurity regions and second impurity regions in the semiconductor layer using the second conductive layer as a mask; forming a negative resist over the substrate; performing rear surface exposure using the gate electrode as a mask to form a negative resist pattern in a self alignment; and introducing the impurity into first impurity regions in the semiconductor using the second conductive layer and the negative resist pattern as masks.

When the semiconductor display device such as the liquid crystal display comprises the polycrystalline silicon TFT having both the hot carrier resistance of the GOLD structure polycrystalline silicon TFT and the off-current suppressing effect of the LDD structure polycrystalline silicon TFT, it is not required that the GOLD structure and the LDD structure are independently formed in the pixel region and the peripheral circuit as the driver circuit. Thus, simplification of the manufacturing process can be expected.

With respect to a structural characteristic of the GOLD structure polycrystalline silicon TFT, the low concentration impurity regions (n$^-$ regions or p$^-$ regions) which is present inside the high concentration impurity regions (n+ regions or p+ regions) as the source region or the drain region are overlapped with the gate electrode. On the other hand, with respect to a structural characteristic of the LDD structure polycrystalline silicon TFT, the low concentration impurity regions (n⁻ regions or p⁻ regions) are not overlapped with the gate electrode. Thus, a TFT structure having both the low concentration impurity regions (defined as Lov regions) which is overlapped with the gate electrode and the low concentration impurity regions (defined as Loff regions) which is not overlapped with the gate electrode is studied. (Since The TFT having such a structure is a kind of the GOLD structure, hereinafter it is described as the GOLD structure.)

FIGS. 1A to 1D show main forming processes of the above GOLD structure polycrystalline silicon TFT. In these drawings, the gate electrode has a two-layers structure comprising a first layer gate electrode 104 having a thin film thickness and a large width and a second layer gate electrode 105 having a thick film thickness and a small width. That is, the first layer gate electrode 104 has a longer size in a channel direction than the second layer gate electrode 105. With respect to a substrate structure under the gate electrode, a semiconductor layer 102 comprising a polycrystalline silicon film and a gate insulating film 103 are laminated on a glass substrate 101. On the substrate, the gate electrode comprising the first layer gate electrode 104 and the second layer gate electrode 105 is formed. Moreover, high concentration impurity regions (n+ regions or p+ regions) 106 as the source region or the drain region are formed in the semiconductor layer 102. Note that the substrate used here is not limited to the glass substrate 101, and a transparent insulating substrate with a heat resistance may be used (see FIG. 1A).

Next, a negative resist with a predetermined film thickness is formed and then exposure processing is performed from the rear surface of the substrate using the first layer gate electrode 104 as a mask. Since the first layer gate electrode 104 comprises a conductive metal material, it has a property for blocking exposure light from the rear surface. On the other hand, the glass substrate 101, the semiconductor layer 102 comprising the polycrystalline silicon film, and the gate insulating film 103 are translucent. Therefore, in a development process, a negative resist film in a region which is light-blocked by the first layer gate electrode 104 is dissolved into a developer and a negative resist film in a region which is not light-blocked thereby is insoluble in the developer, and thus a negative resist pattern 107 is formed. In this case, since interfaces between the light blocking region and the non-light blocking region are uniquely determined by the end portions of the first layer gate electrode 104, the negative resist pattern 107 is formed in a self alignment using the first layer gate electrode 104 as a mask. Bake processing is performed for the negative resist pattern 107 after the development, and thus the final negative resist pattern 107 is formed (see FIG. 1B).

Next, low concentration ion implantation of an n-type or p-type impurity is performed for the semiconductor layer 102 comprising the polycrystalline silicon film corresponding to a region in which the first layer gate electrode 104 is exposed. By the low concentration ion implantation of the n-type or p-type impurity, low concentration impurity regions (n⁻ regions or p⁻ regions) 108 as the Lov regions are formed. In this case, since a mask for the ion implantation comprises the negative resist pattern 107 and the second layer gate electrode 105 having a thick film thickness, it has extremely high blocking performance against the implanted ion. Thus, when an accelerating voltage and the amount of ions to be implanted at the time of ion implantation are suitably selected, an impurity with a suitable concentration can be independently ion-implanted by through dope into only the semiconductor layer 102 corresponding to the exposed region of the first layer gate electrode 104 (see FIG. 1C).

Here, a term "ion implantation" is defined. Generally, the term "ion implantation" is used in the case where an impurity ion which is mass-separated is implanted and a term "ion dope" is used in the case where an impurity ion which is not mass-separated is implanted. However, in this specification, regardless of whether the impurity ion is mass separated or not, a process for introducing the impurity into the polycrystalline silicon film is defined as the ion implantation in the wide sense.

Next, after the negative resist pattern 107 is removed, low concentration ion implantation of an n-type or p-type impurity is performed for the semiconductor layer 102 corresponding to the outside of the first layer gate electrode 104. By the ion implantation, low concentration impurity regions (n⁻⁻ regions or p⁻⁻ regions) 109 as the Loff regions are formed. In this case, the ion implantation is simultaneously performed for the already formed high concentration impurity regions (n+ regions or p+ regions) 106 as the source region or the drain region. However, since the amount of ions to be implanted is small, the influence is not substantially caused. Also, the ion implantation is simultaneously performed through the first layer gate electrode 104 (through dope) for the low concentration impurity regions (n⁻ regions or p⁻ regions) 108 as the Lov regions under the first layer gate electrode 104. However, since most ions to be implanted are blocked by the first layer gate electrode 104, the substantial amount of ions to be implanted can be suppressed to such a level that no problem is caused. Note that, here, the ion implantation is performed after the negative resist pattern 107 is removed. However, even if the ion implantation is performed in the stage shown in FIG. 1A, the same state is basically obtained (see FIG. 1D).

By the above process, the GOLD structure polycrystalline silicon TFT having both the Lov regions and the Loff regions can be formed. A study result with respect to the TFT characteristic of the GOLD structure polycrystalline silicon TFT formed here is shown in FIG. 2. FIG. 2 shows a relationship between a mobility ($\mu_{FE}$) deterioration ratio and the amount of n-type impurities (P ions) to be implanted into the Lov regions and a relationship between an off-current and the amount of n-type impurities (P ions) to be implanted into the Loff regions. This is a result evaluated under a condition that both a size of the Lov region and a size of the Loff region are about 0.7 μm and they are thus identical in size. Here, a hot carrier resistance is evaluated using the mobility ($\mu_{FE}$) deterioration ratio as an index. In FIG. 2, black circles and while circuits indicate a result with respect to the Lov regions and a result with respect to the Loff regions, respectively. As can be seen from this drawing, in order to reduce the mobility ($\mu_{FE}$) deterioration ratio, it is necessary to implant P ions with about $0.8 \times 10^{14}$ ions/cm² to $1.7 \times 10^{14}$ ions/cm² into the Lov regions. Also, in order to reduce the off-current, it is necessary to implant P ions with about $1 \times 10^{13}$ ions/cm² into the Loff regions. From this study result, it can be confirmed that the GOLD structure polycrystalline silicon TFT in which the reduction in the mobility ($\mu_{FE}$) deterioration ratio is compatible with the reduction in the off-current can be formed, that is, the GOLD structure polycrystalline silicon TFT having both the hot carrier resistance and the off current suppressing effect can be formed (see FIG. 2).

Note that the structure of the GOLD structure polycrystalline silicon TFT used in the present experiment is described below. The semiconductor layer in which the source region, the drain region, or the like is formed comprises a polycrystalline silicon film having a film thickness of 50 nm, the gate insulating film comprises a silicon oxynitride film having a film thickness of 110 nm, the first layer gate electrode comprises a TaN film having a film thickness of 30 nm, and the second layer gate electrode comprises a W film having a film thickness of 370 nm. Also, the ion implantation is performed by using an ion dope apparatus for implanting ions with a non-mass-separation state (see FIG. 2).

Next, a study result based on simulation with respect to a characteristic of the above n-channel GOLD structure polycrystalline silicon TFT used in the present experiment is shown in FIGS. 15A to 15C. FIG. 15A shows simulation data of a maximum electron temperature near a junction portion between the drain and the channel in the case where the amounts of P ions to be implanted into the Lov regions are varied. From this result, it is apparent that the electron temperature becomes minimum in the case where the amount of P ions to be implanted into the Lov regions is $1.5 \times 10^{14}$ ions/cm$^2$. This suggests that a generation rate of the hot carrier becomes minimum in the case where the amount of P ions to be implanted into the Lov regions is $1.5 \times 10^{14}$ ions/cm$^2$ and substantially corresponds to the experimental result. FIG. 15B shows simulation data of a maximum electron temperature and an off-current (Ioff) near the junction portion between the drain and the channel in the case where the amount of P ions to be implanted into the Loff regions is changed with a state that the amount of P ions to be implanted into the Lov regions is kept to be $1.5 \times 10^{14}$ ions/cm$^2$. From this result, it is apparent that both the maximum electron temperature and the off-current (Ioff) near the junction portion between the drain and the channel are rapidly decreased in the case where the amount of P ions to be implanted into the Loff regions is $1.5 \times 10^{13}$ ions/cm$^2$ to $0.75 \times 10^{13}$ ions/cm$^2$. In the above experimental result, as the amount of P ions to be implanted into the Loff regions becomes smaller, an on-current (Ion) is linearly decreased. However, when a variation and the like are considered, it is assumed that there is no great inconsistency. On the other hand, with respect to the on-current (Ion), as shown in FIG. 15C, as the amount of P ions to be implanted into the Loff regions becomes smaller, the on-current (Ion) is decreased. However, even in the case where the amount of P ions to be implanted is $0.75 \times 10^{13}$ ions/cm$^2$, the on-current (Ion) is about 50 $\mu$A. Although this is slightly small as the on-current (Ion), it is assumed that this TFT can be applied to a peripheral circuit (see FIGS. 15A to 15C).

Therefore, from the simulation result shown in FIGS. 15A to 15C, the efficiency of the above n-channel GOLD structure polycrystalline silicon TFT is determined. Here, a device structure and the like as a precondition of this simulation will be described below as a supplemental description. In the structure of the above GOLD structure polycrystalline silicon TFT, W/L=8/6 $\mu$m, Lov region=Loff region=0.75 $\mu$m, a polycrystalline silicon film having a film thickness of 50 nm as a silicon film which is a layer for forming the source region, the drain region, and the like, a silicon oxynitride film (permittivity=4.1) having a film thickness of 110 nm as the gate insulating film, a TaN film having a film thickness of 30 nm as the first layer gate electrode, a W film having a film thickness of 370 nm as the second layer gate electrode are assumed. Further, the simulation is performed by fitting channel dope and impurity ion implantation (ion dope method) for the source region and the drain region into an impurity profile of SIMS analysis data. Note that, since a carrier activation rate is unknown, the activation rate is set to be 20% in this simulation. Also, hot carrier reliability cannot be directly evaluated in the simulation. Therefore, the maximum electron temperature (corresponding to kinetic energy of electron) of the junction portion between the drain and the channel is calculated and thus hot carrier evaluation is indirectly performed.

Here, an important point is as follows. That is, when the GOLD structure polycrystalline silicon TFT having both the hot carrier resistance and the off-current suppressing effect is formed, a suitable value of an impurity concentration in the Lov regions are different from that in the Loff regions and it is required that these values are independently controlled. Therefore, in a process for forming the above GOLD structure polycrystalline silicon TFT, the ion implantation into the Lov regions is performed using as a negative resist pattern formed in a self alignment as a mask, independent of the ion implantation into the Loff regions.

In the present invention, as described above, the negative resist and the rear surface exposure method are combined with each other, and the negative resist pattern 107 is thus formed in a self alignment using the first layer gate electrode 104 as a mask. Here, the resist pattern can be formed by a general photolithography to which a positive resist and an exposure apparatus are applied. However, in this case, since a self alignment technique is not applied, a superimposition error is caused dependent on alignment precision of the exposure apparatus. Thus, a micro gap is caused between the first layer gate electrode 104 and the above resist pattern. As a result, at the time of low concentration ion implantation as next process, there is a possibility that ions are simultaneously implanted into a region of semiconductor layer 102, which corresponds to the micro gap between the first layer gate electrode 104 and the above resist pattern, and thus it is a problem to apply the general photolithography process without using the self alignment technique. In order to avoid this problem, according to the present invention, the combination of the negative resist and the rear surface exposure method is applied to the formation of the resist pattern.

A characteristic of the present invention will be described in brief. The present invention is characterized in that in manufacturing a semiconductor display device such as a liquid crystal display device, the pixel region and the peripheral circuit as the driver circuit comprise a GOLD structure polycrystalline silicon TFT having both the Lov regions and the Loff regions, whereby both the simplification of a manufacturing process and the improvement of performance of the semiconductor display device are realized.

Also, according to the present invention, in the case where the GOLD structure polycrystalline silicon TFT having both the Lov regions and the Loff regions is formed, ion implantation into the Lov regions is independently performed using a negative resist pattern formed in a self alignment by the rear surface exposure method as a mask, whereby impurity concentrations of the Lov regions and the Loff regions can be independently controlled. Therefore, the GOLD structure polycrystalline silicon TFT having both the hot carrier resistance and the off-current suppressing effect can be formed.

BRIEF DESCRIPTION OF THE DRAWINGS

In the accompanying drawings:

FIGS. 4A to 4H are cross sectional views showing a method (2) of forming a GOLD structure polycrystalline silicon TFT, to which a two-layers gate electrode forming technique and a rear surface exposure technique are applied;

FIGS. 5A and 5B are cross sectional views showing a method (1) of manufacturing a semiconductor display device (liquid crystal display), to which a two-layers gate electrode forming technique and a rear surface exposure technique are applied;

FIGS. 7A and 7B are cross sectional views showing a method (3) of manufacturing a semiconductor display device (liquid crystal display), to which a two-layers gate electrode forming technique and a rear surface exposure technique are applied;

FIGS. 9A and 9B are cross sectional views showing a method (5) of manufacturing a semiconductor display device (liquid crystal display), to which a two-layers gate electrode forming technique and a rear surface exposure technique are applied;

FIGS. 10A and 10B are cross sectional views showing a method (6) of manufacturing a semiconductor display device (liquid crystal display), to which a two-layers gate electrode forming technique and a rear surface exposure technique are applied;

FIG. 16 shows SIMS analysis data in the case where P ions are implanted.

DESCRIPTION OF THE PREFERRED EMBODIMENTS

[Embodiment Mode 1]

Figure 1A:
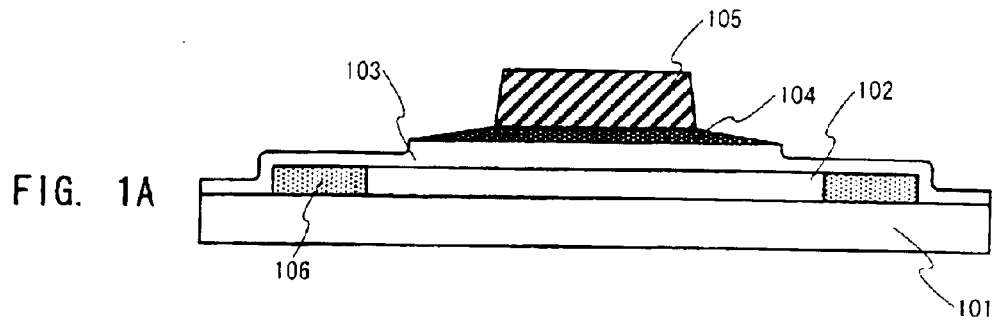
FIGS. 1A to 1D are cross sectional views showing a method of forming a GOLD structure polycrystalline silicon TFT having both Lov regions and Loff regions.
Figure 1B:
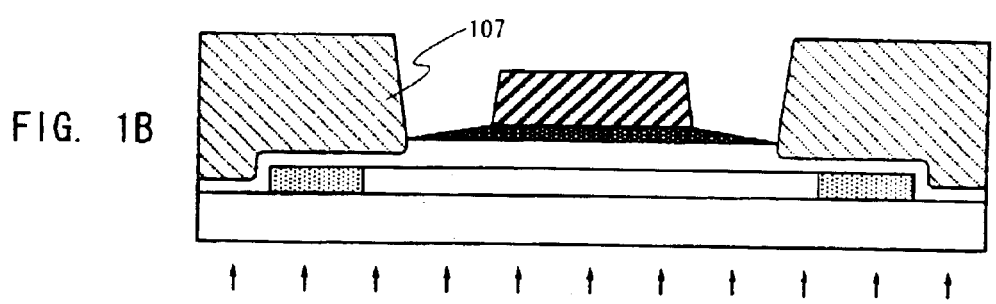
Figure 1C:
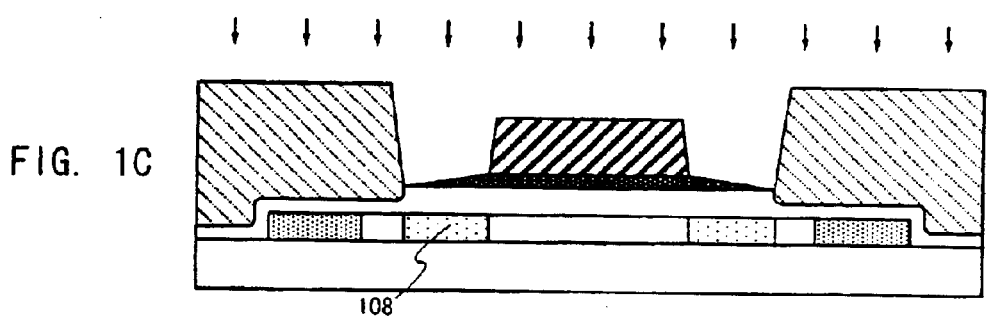
Figure 1D:
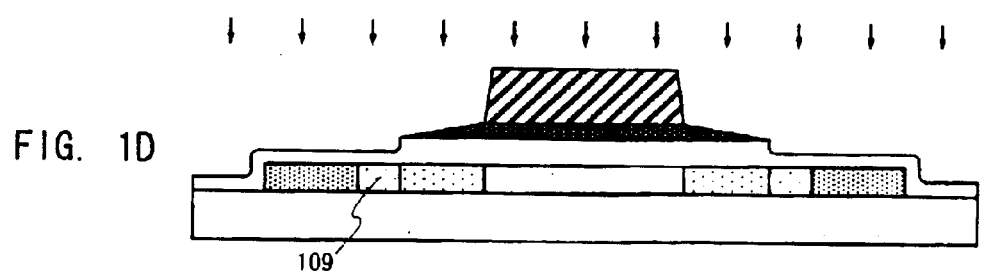
Figure 2:
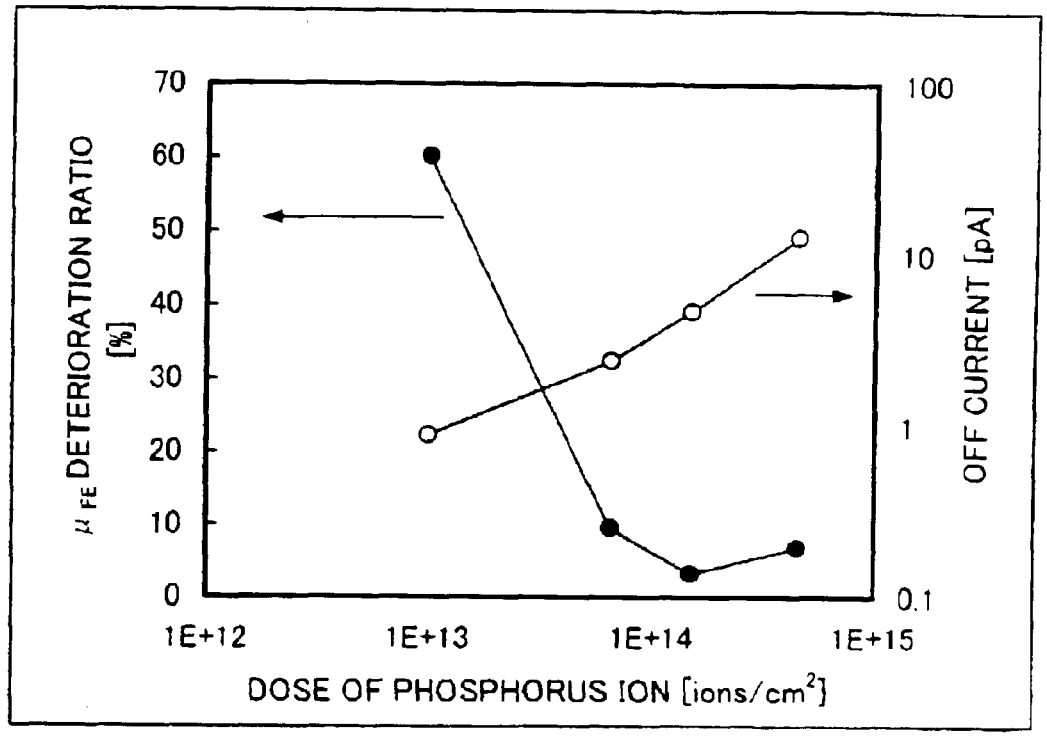
FIG. 2 shows a graph indicating the dependence of the amount of n-type impurities to be implanted in a mobility ($\mu_{FE}$) deterioration ratio and an off-current.
Figure 3A:
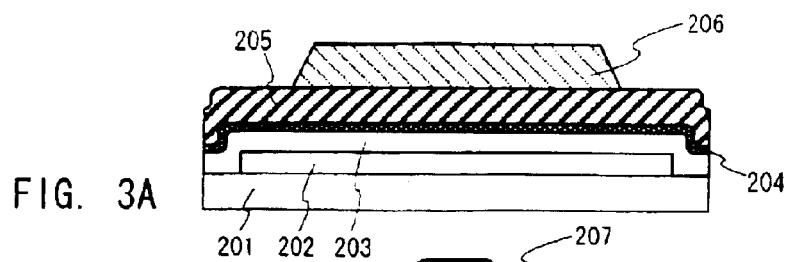
FIGS. 3A to 3H are cross sectional views showing a method (1) of forming a GOLD structure polycrystalline silicon TFT, to which a two-layers gate electrode forming technique and a rear surface exposure technique are applied.
Figure 3B:
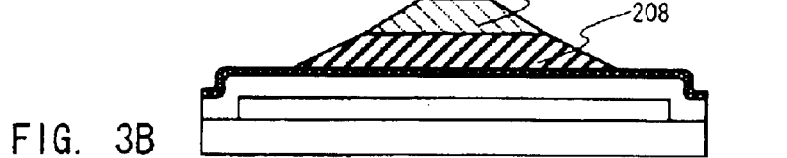
Figure 3C:
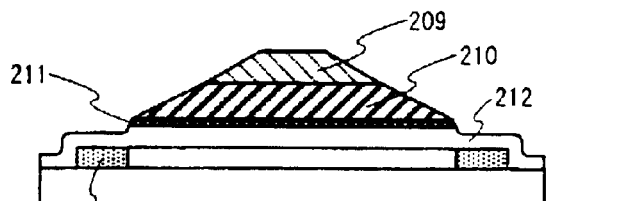
Figure 3D:
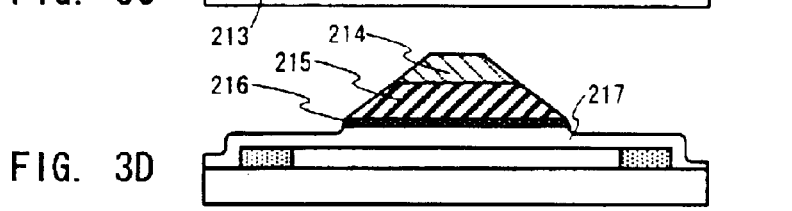
Figure 3E:
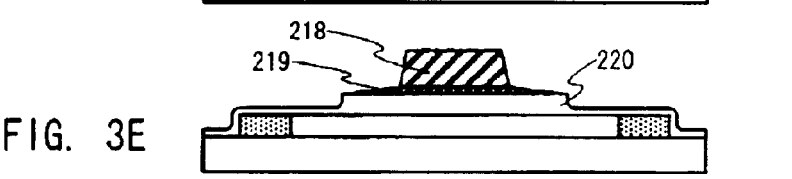
Figure 3F:
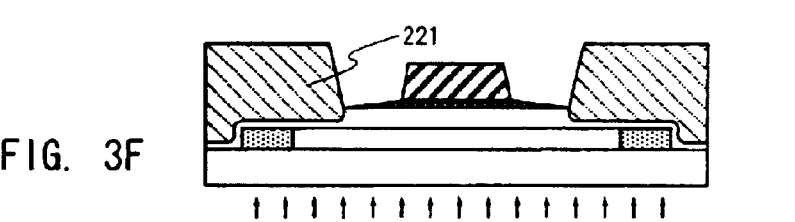
Figure 3G:
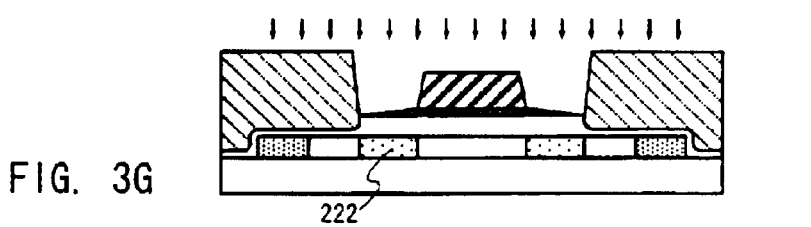
Figure 3H:
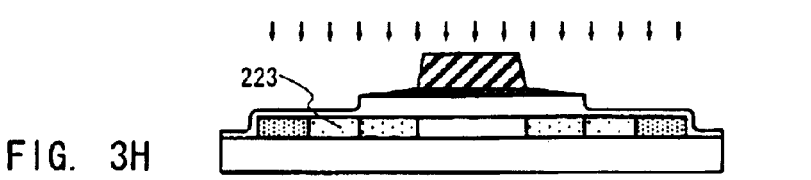
Figures 6A, 6B:
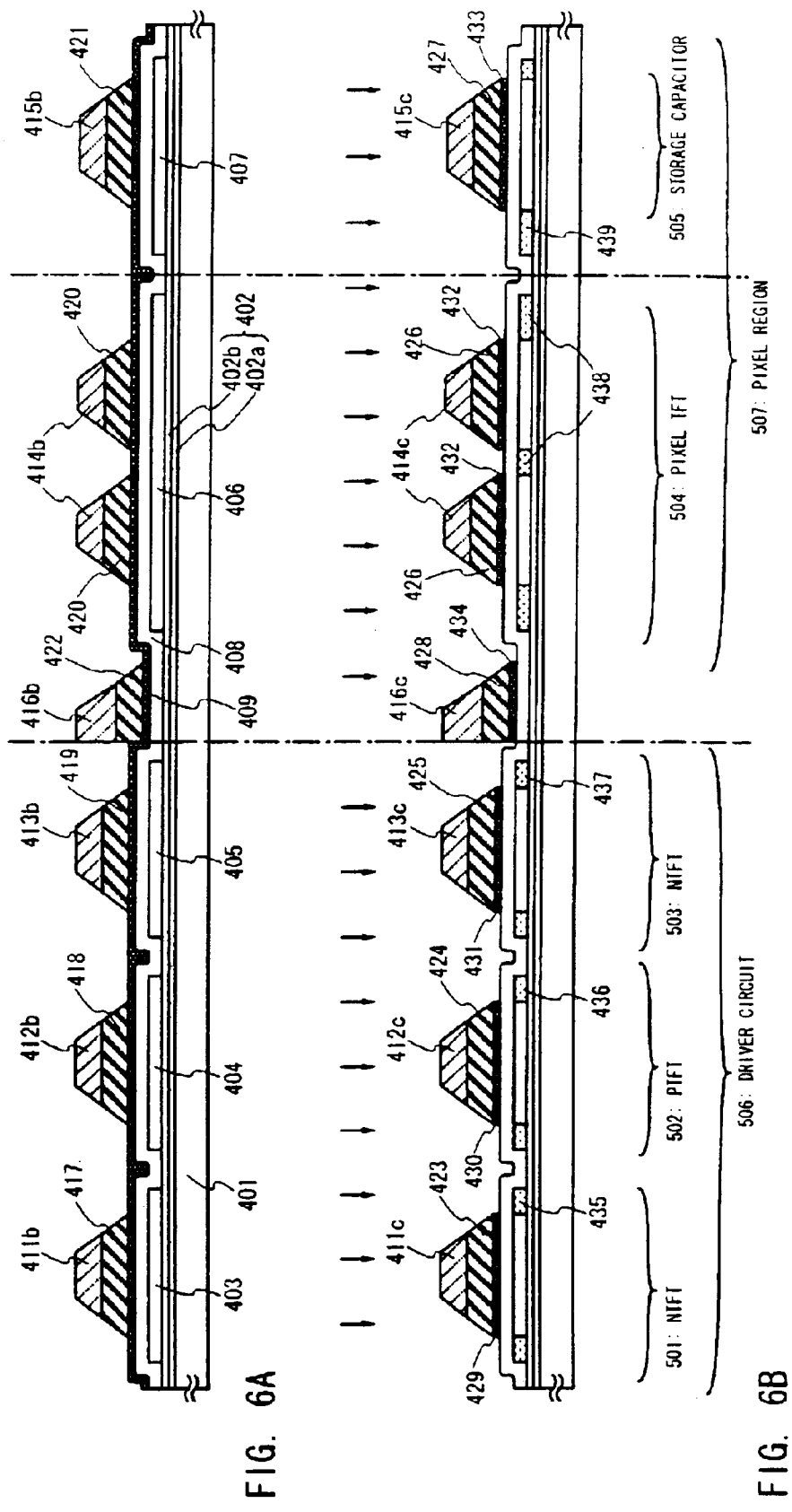
FIGS. 6A and 6B are cross sectional views showing a method (2) of manufacturing a semiconductor display device (liquid crystal display), to which a two-layers gate electrode forming technique and a rear surface exposure technique are applied.
Figure 8A:
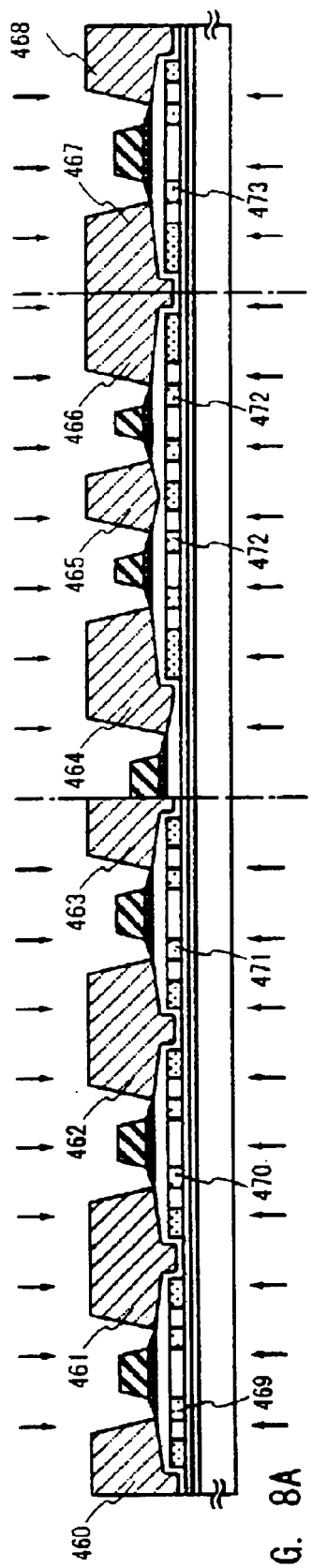
FIGS. 8A and 8B are cross sectional views showing a method (4) of manufacturing a semiconductor display device (liquid crystal display), to which a two-layers gate electrode forming technique and a rear surface exposure technique are applied.
Figure 8B:
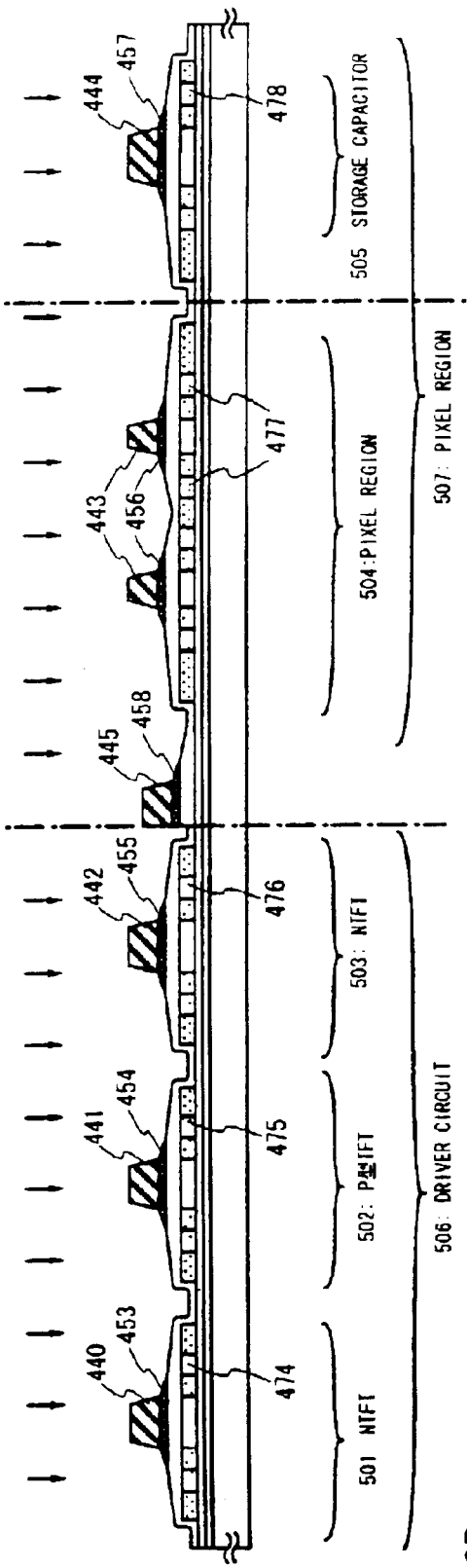

A method of forming a GOLD structure polycrystalline silicon TFT having both Lov regions and Loff regions will be described based on FIGS. 3A to 3H.

With respect to a substrate structure used in this embodiment mode, a semiconductor layer 202 comprising a polycrystalline silicon film, a gate insulating film 203, a first layer gate electrode film 204, and a second layer gate electrode film 205 are laminated to have respective predetermined film thicknesses on a glass substrate 201. On the substrate having such a structure, a resist pattern 206 for forming a gate electrode is formed (see FIG. 3A).

Next, a first step in dry etching processing is performed using the above resist pattern 206 as a mask. By the dry etching processing for a predetermined period, only the second layer gate electrode film 205 is isotropy-etched to form a second layer gate electrode 208 with a taper shape. In this case, with respect to the resist pattern 206 used as the mask in the dry etching, the film thickness of the resist film is decreased from a problem in a selection ratio of the resist film and the second layer gate electrode film 205 as a film to be etched. Therefore, this is altered to a shape of a resist pattern 207 after the dry etching (see FIG. 3B).

Next, subsequently, a second step in the dry etching processing is performed. By the dry etching processing for a predetermined period, the first layer gate electrode film 204 is anisotropically etched using as a mask the second layer gate electrode 208 with a taper shape, which is formed in the above first step to form a first layer gate electrode 211. During overetching, the gate insulating film 203 as a base is exposed to plasma and slightly etched, and thus altered to a shape of a gate insulating film 212 (see FIG. 3C).

Next, using a gate electrode comprising the first layer gate electrode 211 and a second layer gate electrode 210 as a mask, high concentration ion implantation of an n-type impurity as first ion implantation processing is performed. In this case, P (phosphorus) is used as the n-type impurity and the ion implantation is performed with an ion implantation condition that an accelerating voltage is 60 to 100 kV and a dose is $5 \times 10^{14}$ to $5 \times 10^{15}$ ions/cm$^2$. By this first ion implantation processing, high concentration impurity regions (n+ regions) 213 of the n-type impurity as the source region or the drain region are formed in the semiconductor layer 202 comprising a polycrystalline silicon film corresponding to the outside of the above gate electrode (see FIG. 3C).

Next, a third step in the dry etching processing is performed. By the dry etching processing for a predetermined period, both the first layer gate electrode 211 and the second layer gate electrode 210 are isotropy-etched to form a first layer gate electrode 216 and a second layer gate electrode 215 with a taper shape. The film thickness of the resist pattern used as the mask in etching is further decreased, and thus this is altered to a shape of a resist pattern 214. Also, the film thickness of the gate insulating film as a base in a region exposed to plasma is further decreased, and thus this is altered to a shape of a gate insulating film 217 (see FIG. 3D).

Next, subsequently, a fourth step in the dry etching processing is performed. By the dry etching processing for a predetermined period, the second layer gate electrode 215 with a taper shape is anisotropically etched using the resist pattern 214 as a mask to form a second layer gate electrode 218 with a rectangular shape. In this case, as etching the second layer gate electrode 218 is progressed, the first layer gate electrode is exposed to plasma from the end portions. Therefore, the first layer gate electrode 219 is formed with a taper shape such that a film thickness becomes thinner toward the end portions. In addition, the film thickness of the gate insulating film 217 as a base in a region exposed to plasma is further decreased, and thus the gate insulating film 217 is altered to a shape of a gate insulating film 220. After that, the resist pattern as the mask in the etching is removed (see FIG. 3E).

Next, a negative resist film with a predetermined film thickness is applied and bake-processed to form the negative resist film, and then exposure processing is performed from the rear surface of the substrate using the first layer gate electrode 219 as a mask. Since the first layer gate electrode 219 comprises a conductive metal material, it has a property for blocking exposure light from the rear surface. However, since a region except for the first layer gate electrode 219 is a laminate structure of the glass substrate 201, the semiconductor layer 202, and the gate insulating film 220, which are translucent, the exposure light from the rear surface cannot be blocked. Therefore, in a next development process, a negative resist film in a region which is light-blocked by the first layer gate electrode 219 is dissolved into a developer and a negative resist film in a region which is not light-blocked thereby is insoluble in the developer, and thus a negative resist pattern 221 is formed. In this case, since interfaces between the light blocking region and the non-light blocking region are uniquely determined by the end portions of the first layer gate electrode 219, the negative resist pattern 221 is formed in a self alignment using the first layer gate electrode 219 as a mask. After that, bake processing is performed, and thus the final negative resist pattern 221 is formed (see FIG. 3F).

Next, low concentration ion implantation of an n-type impurity as second ion implantation processing is performed for the semiconductor layer 202 comprising the polycrystalline silicon film corresponding to a region (exposed region) of the first layer gate electrode 219, which is exposed from the second layer gate electrode 218. Here, since the negative resist pattern 221 and the second layer gate electrode 218 having the thick film thickness are used as a mask for the ion implantation, the blocking capability against the implanted ion is extremely high. Thus, when an accelerating voltage and the amount of ions to be implanted at the time of ion implantation are suitably selected, an impurity with a suitable concentration can be independently ion-implanted with through dope into only the semiconductor layer 202 corresponding to the exposed region of the first layer gate electrode 219. As a concrete ion implantation condition, P (phosphorus) is used as the n-type impurity and the ion implantation is performed with an accelerating voltage of 60 to 100 kV and a dose of $0.8 \times 10^{14}$ ions/cm$^2$ to $1.7 \times 10^{14}$ ions/cm$^2$. As a result, low concentration impurity regions (n$^-$ regions) 222 as the Lov regions are formed in the above regions of the semiconductor layer 202. Note that the first layer gate electrode 219 has a taper shape such that a film thickness becomes thinner toward the end portions of the gate electrode. Therefore, a concentration gradient is present with respect to the impurity concentration of the low concentration impurity regions (n$^-$ regions) 222 ion-implanted by the through dope and the impurity concentration tends to gradually increase toward the end portions of the first layer gate electrode 219, that is, the high concentration impurity regions (n+ regions) 213 as the source region or the drain region (see FIG. 3G).

Next, after the negative resist pattern 221 is removed, low concentration ion implantation of an n-type impurity is performed for the semiconductor layer 202 corresponding to the outside of the first layer gate electrode 219. By the ion implantation, low concentration impurity regions (n$^{--}$ regions) 223 as the Loff regions are formed. As an ion implantation condition, P (phosphorus) is used as the n-type impurity and the ion implantation is performed with an accelerating voltage of 60 to 100 kV and a dose of $1 \times 10^{13}$ ions/cm$^2$. In this case, the ion implantation is simultaneously performed for the already formed high concentration impurity regions (n+ regions) 213 as the source region or the drain region. However, since the amount of ions to be implanted is small, the influence is not almost caused. In addition, the ion implantation is simultaneously performed through the first layer gate electrode 219 (through dope) for the low concentration impurity regions (n$^-$ regions) 222 as the Lov regions under the first layer gate electrode 219. However, since most ions to be implanted are blocked by the first layer gate electrode 219, the substantial amount of ions to be implanted can be suppressed to such a level that no problem is caused. Note that, here, the ion implantation is performed after the negative resist pattern 221 is removed. However, even if the ion implantation is performed in the stage shown in FIG. 3E, the same state is basically obtained (see FIG. 3H).

By the above processes, the GOLD structure polycrystalline silicon TFT having both the Lov regions and the Loff regions can be formed and the GOLD structure polycrystalline silicon TFT is characterized by having advantages of both the hot carrier resistance and the off-current suppressing effect.

[Embodiment Mode 2]

Another method of forming a GOLD structure polycrystalline silicon TFT having both Lov regions and Loff regions will be described based on FIGS. 4A to 4H. Although this embodiment mode is substantially similar to Embodiment mode 1, there is a slight difference in a method of forming a gate electrode. Therefore, this point will be described as the emphasis.

With respect to a substrate structure used in this embodiment mode, a semiconductor layer 302 comprising a polycrystalline silicon film, a gate insulating film 303, a first layer gate electrode film 304, and a second layer gate electrode film 305 are laminated at respective predetermined film thicknesses on a glass substrate 301. On the substrate having such a structure, a resist pattern 306 for forming a gate electrode is formed (see FIG. 4A).

Next, a first step and a second step in dry etching processing are performed in succession using the above resist pattern 306 as a mask to form a first layer gate electrode 311 and a second layer gate electrode 310 with a taper shape. In this case, the resist pattern 306 to be used as the mask in the dry etching is altered to a shape of a resist pattern 309 after the dry etching and the gate insulating film 303 as a base is altered to a shape of a gate insulating film 312 by a film decrease (see FIG. 4B and FIG. 4C).

Next, using a gate electrode comprising the first layer gate electrode 311 and the second layer gate electrode 310 as a mask, high concentration ion implantation of an n-type impurity as first ion implantation processing is performed. By this first ion implantation processing, high concentration impurity regions (n+ regions) 313 of the n-type impurity as the source region or the drain region are formed (see FIG. 4C).

Next, a third step in the dry etching processing is performed. By the dry etching processing for a predetermined period, the second layer gate electrode 310 with a taper shape is anisotropically etched using the resist pattern 309 as a mask to form a second layer gate electrode 315 with a rectangular shape. In this case, as etching of the second layer gate electrode 310 is progressed, the first layer gate electrode is exposed to plasma from the end portions. Therefore, the first layer gate electrode 316 is formed with a taper shape such that a film thickness becomes thinner toward the end portions. Also, since the film thickness of the gate insulating film 312 as a base in a region exposed to plasma is further decreased, the gate insulating film 312 is altered to a shape of a gate insulating film 317, (see FIG. 4D).

Next, subsequently, a fourth step in the dry etching processing is performed. By the dry etching processing for a predetermined period, the film thickness of the first layer gate electrode 316 in the taper shaped regions, which is exposed from the second layer gate electrode 315 becomes thinner by the film decrease. Thus, a first layer gate electrode 319 in which the end portions of the taper shaped regions are backed is formed. In this case, when a dry etching processing condition is suitably changed, the size of the first layer gate electrode 319 can be freely adjusted within the taper shaped regions. Also, the film thickness of the gate insulating film as a base, which is exposed from the first layer gate electrode 319, is further decreased by the dry etching, and this is thus altered to a shape of a gate insulating film 320. After that, the resist pattern as the mask in the dry etching is removed (see FIG. 4E).

Next, a negative resist pattern 321 is formed in a self alignment by rear surface exposure using the first layer gate electrode 319 as a mask (see FIG. 4F).

Next, low concentration ion implantation of an n-type impurity (accelerating voltage; 60 to 100 kV and dose; $1 \times 10^{14}$ ions/cm$^2$) as second ion implantation processing is performed for the semiconductor layer 302 comprising the polycrystalline silicon film corresponding to a region of the first layer gate electrode 319, which is exposed from the second layer gate electrode 318. By this ion implantation processing, low concentration impurity regions (n$^-$ regions) 322 as the Lov regions are formed (see FIG. 4G).

After the negative resist pattern 321 is removed, low concentration ion implantation of an n-type impurity (accelerating voltage; 60 to 100 kV and dose; $1 \times 10^{13}$ ions/cm$^2$) as third ion implantation processing is performed for the semiconductor layer 302 comprising the polycrystalline silicon film corresponding to the outside of the first layer gate electrode 319. By the ion implantation, low concentration impurity regions (n$^{--}$ regions) 323 as the Loff regions are formed (see FIG. 4H).

[Embodiment 1]

A method of manufacturing an active matrix liquid crystal display comprising a GOLD structure polycrystalline silicon TFT having both Lov regions and Loff regions will be concretely described based on FIGS. 5A and 5B to 11.

First, a silicon oxynitride silicon film 402a of a first layer having a film thickness of 50 nm and a silicon oxynitride film 402b of a second layer having a film thickness of 100 nm, which have different composition ratios are deposited on a glass substrate 401 by a plasma CVD method to form a base film 402. Note that, as a material of the glass substrate 401 used here, there is quartz glass, barium borosilicate glass, aluminoborosilicate glass, or the like. Next, after an amorphous silicon film is deposited to have a thickness of 55 nm on the above base film 402 (402a and 402b) by a plasma CVD method, a solution containing nickel is kept on the amorphous silicon film. After this amorphous silicon film is dehydrogenated (500° C. and 1 hour), thermal crystallization (550° C. and 4 hours) is performed and laser anneal processing is further performed to make a polycrystalline silicon film. When the polycrystalline silicon film thermal-crystallized using a catalyst in the solution containing nickel or the like is compared with a general polycrystalline silicon film, there are such characteristics that crystal grains are oriented in a substantially identical direction, field effect mobility is high, and the like. Thus, in this specification, in particular, this is also referred to as a crystalline silicon film (see FIG. 5A).

Next, the polycrystalline silicon film is patterned by a photolithography process and an etching process to from semiconductor layers 403 to 407. In this case, after forming the semiconductor layers 403 to 407, doping of an impurity element (boron or phosphorus) for controlling Vth of a TFT may be performed. Next, in order to cover the semiconductor layers 403 to 407, a gate insulating film 408 comprising a silicon oxynitride film having a thickness of 110 nm is formed by a plasma CVD method. Further, a first layer gate electrode film 409 comprising a TaN film having a thickness of 30 nm and a second layer gate electrode film 410 comprising a W film having a thickness of 370 nm are deposited on the gate insulating film 408 by a sputtering method. Here, as materials of the first layer gate electrode film 409 and the second layer gate electrode film 410, there is high melting metal which can be resistant to a later process temperature and a compound containing the high melting metal, for example, metal nitride, metal suicide or the like. In this embodiment, the TaN film is used as the first layer gate electrode film 409 and the W film is used as the second layer gate electrode film 410 (see FIG. 5A).

Resist patterns 411a to 414a for forming gate electrodes and resist patterns 415a and 416a for forming electrodes are formed on the substrate having the above structure by photolithography processing (FIG. 5B).

Next, a first step in dry etching processing is performed using the above resist patterns 411a to 416a as a mask. By the dry etching processing for a predetermined period, only the second layer gate electrode film 410 comprising the W film is isotropy-etched to form second layer gate electrodes 417 to 420 and second layer electrodes 421 and 422, which have taper shapes. In this case, with respect to the resist patterns 411a to 416a used as the masks in the dry etching, the film thicknesses of the resist films are decreased from a problem in a selection ratio of the resist films and the second layer gate electrode film (W film) 410 as a film to be etched. Therefore, these are altered to shapes of resist patterns 411b to 416b after the dry etching (see FIG. 6A).

Next, subsequently, a second step in the dry etching processing is performed. By the dry etching processing for a predetermined period, the first layer gate electrode film 409 is anisotropically etched using as masks the second layer gate electrodes 423 to 426 with taper shapes, which are formed in the above first step process to form first layer sate electrodes 429 to 432. Also, the first layer gate electrode film 409 is anisotropically etched using as masks the second layer electrodes 427 and 428 with taper shapes to form first layer electrodes 433 and 434. In this case, by etching, the film thickness of the gate insulating film 408 comprising the silicon oxynitride film as a base is decreased by about 20 nm, and thus a remaining film thickness becomes about 90 nm (see FIG. 6B).

Next, using as masks a gate electrode comprising the first layer gate electrodes 429 to 432 and the second layer gate electrodes 423 to 426 and an electrode comprising the first layer electrode 433 and the second layer electrode 427, high concentration ion implantation of an n-type impurity as first ion implantation processing is performed. In this case, P (phosphorus) is used as the n-type impurity and the ion implantation is performed with an ion implantation condition that an accelerating voltage is 60 to 100 kV and a dose is $5 \times 10^{14}$ to $5 \times 10^{15}$ ions/cm$^2$. By this first ion implantation processing, high concentration impurity regions (n+ regions) 435 to 438 of the n-type impurity as the source regions or the drain regions are formed in the semiconductor layers 403 to 406 comprising polycrystalline silicon films corresponding to the outside of the above gate electrodes. On the other hand, ion implantation is performed for the semiconductor layer 407 as a region for forming a retaining capacitor 505 using the above electrode for forming the capacitor as a mask to form high concentration impurity regions, (n+ regions) 439 in a region (exposed region) corresponding to the outside of the electrode. Note that impurity concentrations of the above high concentration impurity regions (n+ regions) 435 to 439 are generally about $1 \times 10^{20}$ to $1 \times 10^{22}$ atoms/cm$^3$ in a maximum concentration region (see FIG. 6B).

Here, P element concentrations in the above high concentration impurity regions (n+ regions) 435 to 439 are studied in details based on SIMS analysis data shown in FIG. 16. Note that FIG. 16 shows the SIMS analysis data in the case where phosphine (PH$_3$) with a concentration of 5% and hydrogen (H$_2$) are used as P ion materials and ion implantations are performed for three kinds of substrates on which (1) a TaN film (15 nm) and a silicon oxide film are formed, (2) a TaN film (30 nm) and the silicon oxide film are formed, and (3) the silicon oxide film is formed, by an ion dope apparatus with a condition that an accelerating voltage is 90 kV, a current density is (0.5 $\mu$A/cm$^2$, and a dose is 1.5×10$^{14}$ ions/cm$^2$. Also, in this drawing, an impurity profile in a depth direction is an impurity profile in the silicon oxide film except for the TaN film. With respect to a film structure of the above high concentration impurity regions (n+ regions) 435 to 439, the silicon oxynitride film (about 90 nm in remaining film thickness by etching film decrease) and the polycrystalline silicon film (50 nm in thickness) are located from the surface and ion blocking performances of the silicon oxynitride film and the polycrystalline silicon film are substantially identical to ion blocking performance of the silicon oxide film. Therefore, the impurity concentrations of the above high concentration impurity regions (n+ regions) 435 to 439, that is, the impurity concentrations in the polycrystalline silicon films (50 nm in thickness) are studied based on the impurity profile of the substrate on which (3) the silicon oxide film is formed, shown in FIG. 16. In the case where a dose is 1.5×10$^{14}$ ions/cm$^2$, it is readable that an impurity concentration in the polycrystalline silicon film is 5×10$^{18}$ to 8×10$^{18}$ atoms/cm$^3$. Thus, in the case where an actual dose is 5×10$^{14}$ to 5×10$^{15}$ ions/cm$^2$, it is considered by proportional calculation that an impurity concentration in the polycrystalline silicon film is about 1.7×10$^{19}$ to 2.7×10$^{20}$ atoms/cm$^3$. In addition, in the actual ion implantation, since an accelerating voltage is within 60 to 100 kV, it is expected that a range of the impurity concentration is further expanded by the influence of the set accelerating voltage. In consideration of this point, a range obtained by multiplying a minimum value by 0.2 times correction coefficients and a maximum value by about 20 times correction coefficients is assumed in maximum as the impurity concentrations of the above high concentration impurity regions (n+ regions) 435 to 439. Thus, it is estimated that the impurity concentrations of the above high concentration impurity regions (n+ regions) 435 to 439 are about 3×10$^{18}$ to 5×10$^{21}$ atoms/cm$^3$, and preferably, about 1.7×10$^{19}$ to 2.7×10$^{20}$ atoms/cm$^3$ (see FIG. 16).

Next, a third step in the dry etching processing is performed. By the dry etching processing for a predetermined period, the second layer gate electrodes 423 to 426 and the second layer electrodes 427 and 428, which have taper shapes are anisotropically etched using the resist patterns 411c to 416c as masks to form second layer gate electrodes 440 to 443 and second layer electrodes 444 and 445, which have rectangular shapes. In this case, as etching of the second layer gate electrodes 423 to 426 and the second layer electrodes 427 and 428 is progressed, the first layer gate electrodes and the first layer electrode, which are present thereunder are exposed to plasma from the end portions. Thus, first layer gate electrodes 446 to 449 and the first layer electrodes 450 and 451 are formed with taper shapes such that remaining film thicknesses become thinner toward the end portions. Also, the film thickness of the gate insulating film as a base in a region exposed to plasma is decreased, and this is thus altered to a shape of a gate insulating film 452 (FIG. 7A).

Next, subsequently, a fourth step in the dry etching processing is performed. By the dry etching processing for a predetermined period, the remaining film thicknesses of the first layer gate electrodes 446 to 449 in the taper shaped regions, which are exposed from the second layer gate electrodes 440 to 443 become thinner by the film decrease. Thus, first layer gate electrodes 453 to 456 in which the end portions of the taper shaped regions are backed are formed. In this case, when a dry etching processing condition is suitably changed, the sizes of the first layer gate electrodes 453 to 456 can be freely adjusted within the taper shaped regions. Similarly, the remaining film thicknesses of the exposed first layer electrodes 450 and 451 in the taper shaped regions become thinner by the film decrease. Thus, first layer electrodes 457 and 458 in which the end portions of the taper shaped regions are backed are formed. Also, the film thickness of the gate insulating film as a base is further decreased by the dry etching, and this is thus altered to a shape of a gate insulating film 459. With this stage, the film thickness of the gate insulating film 459 comprising the silicon oxynitride film as a base is further decreased, and thus a remaining film thickness in a region with a thick film thickness becomes about 50 nm and a remaining film thickness in a region with a thin film thickness becomes about 30 nm. After that, the resist patterns as the masks in the dry etching are removed (see FIG. 7B).

Figure 11:
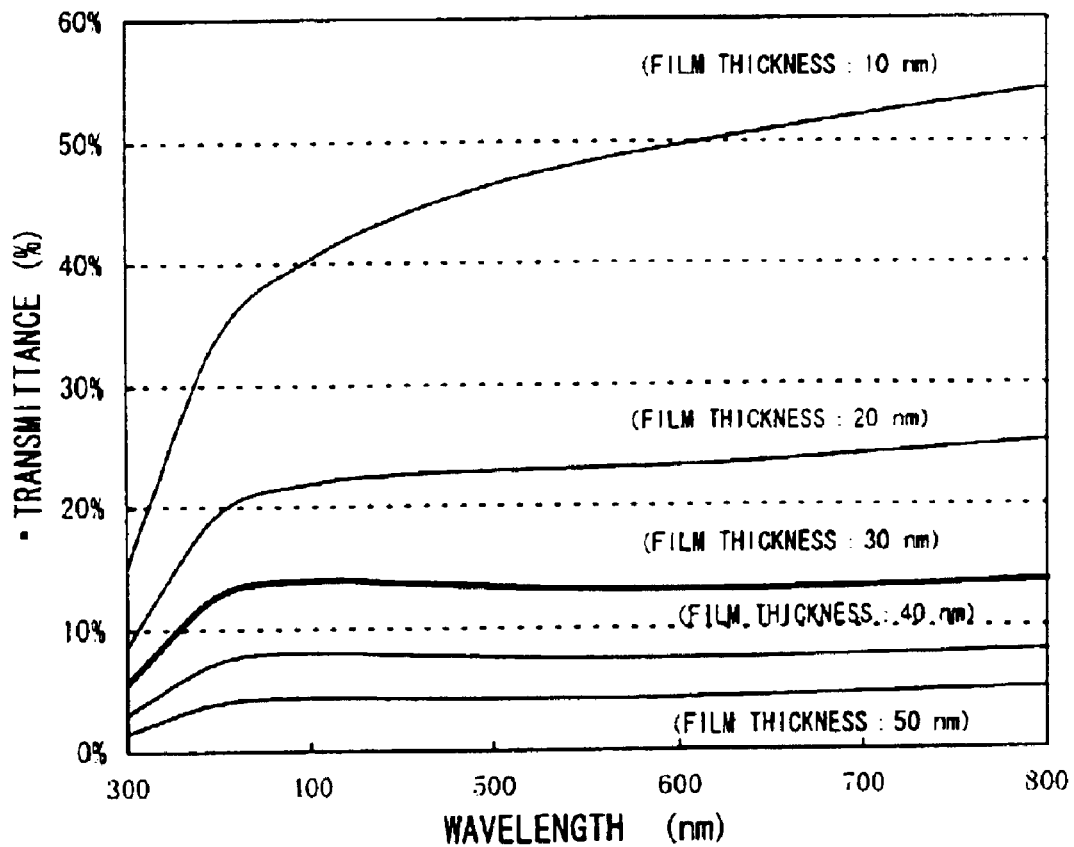
FIG. 11 shows a graph indicating transmittance data of a TaN film.

Next, a negative resist film with a predetermined film thickness is applied and bake-processed to form the negative resist film, and then exposure processing is performed from the rear surface of the substrate using the first layer gate electrodes 453 to 456 and the first layer electrodes 457 and 458 as masks. The first layer gate electrodes 453 to 456 and the first layer electrodes 457 and 458 comprise a TaN film having a film thickness of 30 nm and the transmittance against light having a wavelength of about 350 to 450 nm is about 14% (FIG. 11). Therefore, those have a property for substantially blocking exposure light (typical wavelengths; 436 nm in g-line, 405 nm in h-line, and 365 nm in i-line) from the rear surface. On the other hand, since regions except for the first layer gate electrodes 453 to 456 and the first layer electrodes 457 and 458 are a laminate structure of the glass substrate 401, the semiconductor layers 403 to 407, and the gate insulating film 459, which are translucent, the exposure light from the rear surface cannot be blocked. Therefore, in a next development process, negative resist films in regions which are light-blocked by the first layer gate electrodes 453 to 456 and the first layer electrodes 457 and 458 are dissolved into a developer and negative resist films in regions which are not light-blocked thereby is insoluble in the developer, and thus negative resist patterns 460 to 468 are formed. Since interfaces between the light blocking regions and the non-light blocking regions are uniquely determined by the end portions of the first layer gate electrodes 453 to 456 and the first layer electrodes 457 and 458, the negative resist patterns 460 to 468 are formed in a self alignment using the first layer gate electrodes 453 to 456 and the first layer electrodes 457 and 458 as masks. After that, bake processing is performed, and thus the final negative resist pattern 460 to 468 are formed (see FIG. 8A).

Next, low concentration ion implantation of an n-type impurity as second ion implantation processing is performed for the semiconductor layers 403 to 407 corresponding to regions of the first layer gate electrodes 453 to 456 and the first layer electrode 457, which are exposed from the second layer gate electrodes 440 to 443 and the second layer electrode 444. Here, since the negative resist patterns 460 to 468, the second layer gate electrodes 440 to 443, and the second layer electrode 444, which have the thick film thickness are used as masks for the ion implantation, the blocking capability against the implanted ion is extremely high. Thus, when an accelerating voltage and the amount of ions to be implanted at the time of ion implantation are suitably selected, an impurity with a suitable concentration can be independently ion-implanted with through dope into only regions of the semiconductor layers 403 to 407 corresponding to the exposed regions of the first layer gate electrodes 453 to 456 and the first layer electrode 457. As a concrete ion implantation condition, P (phosphorus) is used as the n-type impurity and the ion implantation is performed with a condition of an accelerating voltage of 60 to 100 kV and a dose of $1\times10^{14}$ ions/cm$^2$. As a result, low concentration impurity regions (n$^-$ regions) 469 to 472 as the Lov regions are formed in the semiconductor layers 403 to 406 for forming gate electrodes. Also, low concentration impurity regions (n$^-$ regions) 473 (these are not gate electrode forming regions and thus are not the Lov regions) are formed in the semiconductor layers 407 for forming the capacitor. Note that the first layer gate electrodes 453 to 456 and the first layer electrode 457 have such taper shapes that remaining film thicknesses become thinner toward the end portions of the gate electrodes. Thus, a concentration gradient is present with respect to the impurity concentration of the low concentration impurity regions (n$^-$ regions) 469 to 473 ion-implanted by the through dope and the impurity concentration tends to gradually increase toward the high concentration impurity regions (n+ regions) 435 to 439 (see FIG. 8A).

Here, P element concentrations in the above low concentration impurity regions (n$^-$ regions) 469 to 472 are studied in details based on the SIMS analysis data shown in FIG. 16. Note that FIG. 16 shows the SIMS analysis data in the case where phosphine (PH$_3$) with a concentration of 5% and hydrogen (H$_2$) are used as P ion materials and ion implantations are performed for three kinds of substrates on which (1) the TaN film (15 nm) and the silicon oxide film are formed, (2) the TaN film (30 nm) and the silicon oxide film are formed, and (3) the silicon oxide film is formed, by an ion dope apparatus with a condition that an accelerating voltage is 90 kV, a current density is 0.5 $\mu$A/cm$^2$, and a dose is $1.5\times10^{14}$ ions/cm$^2$. With respect to a film structure of the above low concentration impurity regions (n$^-$ regions) 469 to 472, the first layer gate electrodes 453 to 456 (TaN film thickness; about 0 to 30 nm because of etching film decrease), the silicon oxynitride film (110 nm in thickness), and the polycrystalline silicon film (50 nm in thickness) are located from the surface and ion blocking performance of the silicon oxynitride film and the polycrystalline silicon film are substantially identical to ion blocking performance of the silicon oxide film. Thus, the impurity concentrations of the low concentration impurity regions (n$^-$ regions) 469 to 472, that is, the impurity concentrations in the polycrystalline silicon films (50 nm in thickness) are studied based on the impurity profile of the substrate on which (2) the TaN film (30 nm) and the silicon oxide film are formed and the impurity profile of the substrate on which (3) the silicon oxide film is formed, shown in FIG. 16. In the case where a dose is $1.5\times10^{14}$ ions/cm$^2$, it is readable that an impurity concentration in the polycrystalline silicon film is $1.5\times10^{17}$ to $8\times10^{18}$ atoms/cm$^3$. Therefore, in the case where an actual dose is $1\times10^{14}$ ions/cm$^2$, it is considered by proportional calculation that an impurity concentration in the polycrystalline silicon film is about $1\times10^{17}$ to $5.3\times10^{18}$ atoms/cm$^3$. Also, in the actual ion implantation, since an accelerating voltage is within 60 to 100 kV, it is expected that a range of the impurity concentration is further expanded by the influence of the set accelerating voltage. In consideration of this point, a range obtained by multiplying a minimum value by 0.2 times correction coefficients and a maximum value by about 5 times as correction coefficients is assumed in maximum as the impurity concentrations of the low concentration impurity regions (n$^-$ regions) 469 to 472. Thus, it is estimated that the impurity concentrations of the low concentration impurity regions (n$^-$ regions) 469 to 472 are about $2\times10^{16}$ to $2.7\times10^{19}$ atoms/cm$^3$, and preferably, about $1\times10^{17}$ to $5.3\times10^{18}$ atoms/cm$^3$ (see FIG. 16).

Next, after the negative resist patterns 460 to 468 are removed, low concentration ion implantation of an n-type impurity as third ion implantation processing is performed for the semiconductor layers 403 to 407 corresponding to the outsides of the first layer gate electrodes 453 to 456 and the first layer electrode 457. By the ion implantation, low concentration impurity regions (n$^{--}$ regions) 474 to 477 as the Loff regions are formed in the semiconductor layers 403 to 406 for forming the gate electrodes and low concentration impurity regions (n$^{--}$ regions) 478 are formed in the semiconductor layer 407 for forming the capacitor. In this case, P (phosphorus) is used as the n-type impurity and the ion implantation is performed with a condition of an accelerating voltage of 60 to 100 kV and a dose of $1\times10^{18}$ ions/cm$^2$. The ion implantation is simultaneously performed for the already formed high concentration impurity regions (n+ regions) 435 to 439. However, since the amount of ions to be implanted is small, the influence is not almost caused. Also, the ion implantation is simultaneously performed through the first layer gate electrodes 453 to 456 and the first layer electrode 457 (through dope) for the already formed low concentration impurity regions (n$^-$ regions) 469 to 473. However, since most ions to be implanted are blocked by the first layer gate electrodes 453 to 456 and the first layer electrode 457, the substantial amount of ions to be implanted can be suppressed to a level that no problem is caused. Note that, here, the ion implantation is performed after the negative resist patterns 460 to 468 are removed. However, even if the ion implantation is performed in the stage shown in FIG. 7B, which the fourth step in the dry etching is completed, the same state is basically obtained (see FIG. 8B).

Here, P element concentrations in the above low concentration impurity regions (n$^{--}$ regions) 474 to 477 are studied in details based on the SIMS analysis data shown in FIG. 16. Note that FIG. 16 shows the SIMS analysis data in the case where phosphine (PH$_3$) with a concentration of 5% and hydrogen (H$_2$) are used as P ion materials and ion implantations are performed for three kinds of substrates on which (1) the TaN film (15 nm) and the silicon oxide film are formed, (2) the TaN film (30 nm) and the silicon oxide film are formed, and (3) the silicon oxide film is formed, by an ion dope apparatus with a condition that an accelerating voltage is 90 kV, a current density is 0.5 $\mu$A/cm$^2$, and a dose is $1.5\times10^{14}$ ions/cm$^2$. With respect to a film structure of the above low concentration impurity regions (n$^{--}$ regions) 474 to 477, the silicon oxynitride film (about 50 nm in estimated remaining film thickness because of etching film decrease) and the polycrystalline silicon film (50 nm in thickness) are located from the surface and ion blocking performances of the silicon oxynitride film and the polycrystalline silicon film are substantially identical to ion blocking performance of the silicon oxide film. Therefore, the impurity concentrations of the low concentration impurity regions (n$^{--}$ regions) 474 to 477, that is, the impurity concentrations in the polycrystalline silicon films (50 nm in thickness) are studied based on the impurity profile of the substrate on which (3) the silicon oxide film is formed, shown in FIG. 16. In the case where a dose is $1.5 \times 10^{14}$ ions/cm$^2$, it is readable that an impurity concentration in the polycrystalline silicon film is $7 \times 10^{18}$ to $8 \times 10^{18}$ atoms/cm$^3$. Thus, in the case where an actual dose is $1 \times 10^{13}$ ions/cm$^2$, it is considered by proportional calculation that an impurity concentration in the polycrystalline silicon film is about $4.7 \times 10^{17}$ to $5.3 \times 10^{17}$ atoms/cm$^3$. Also, in the actual ion implantation, since an accelerating voltage is within 60 to 100 kV, it is expected that a range of the impurity concentration is further expanded by the influence of the set accelerating voltage. In consideration of this point, a range obtained by multiplying a minimum value by 0.01 times correction coefficients and a maximum value by about 5 times as correction coefficients is assumed in maximum as the impurity concentrations of the low concentration impurity regions (n$^{--}$ regions) 474 to 477. Therefore, it is estimated that the impurity concentrations of the low concentration impurity regions (n$^{--}$ regions) 474 to 477 are about $4.7 \times 10^{15}$ to $2.7 \times 10^{18}$ atoms/cm$^3$, and preferably, about $4.7 \times 10^{17}$ to $5.3 \times 10^{17}$ atoms/cm$^3$ (see FIG. 16).

Next, in order to open a region of a p-channel TFT 502 in a driver circuit 506 and a region of a retaining capacitor 505 in a pixel region 507 with resists, resist patterns 479 to 481 are formed by a photolithography (see FIG. 9A).

High concentration ion implantation of a p-type impurity as fourth ion implantation processing is performed using the above resist patterns 479 to 481 as masks. B (boron) as a p-type impurity for providing a conductivity type opposite to the above mentioned one conductivity type, or the like is ion-implanted into the semiconductor layer 404 as a region for forming the p-channel TFT 502 using the first layer gate electrode 454 and the second layer gate electrode 441 as masks. As a result, high concentration impurity regions (p+ regions) 482 as the source region or the drain region are formed in regions corresponding to the outside of the first layer gate electrode 454. Simultaneously, low concentration impurity regions (p− regions) 483 are formed by through dope in regions in which only the first layer gate electrode 454 is exposed. Although P (phosphorus) as an n-type impurity is already ion-implanted into the semiconductor layer 404, the ion implantation is performed with a high concentration such that a concentration of the B (boron) becomes $2 \times 10^{20}$ to $2 \times 10^{21}$ atoms/cm$^3$. Thus, the high concentration impurity regions (p+ regions) 482 and the low concentration impurity regions (p− regions) 483, which contains the p-type impurity are formed, and can be functioned as the p-channel TFT 502. Also, in the semiconductor layer 407 as the forming region for the retaining capacitor 505, high concentration impurity regions (p+ regions) 484 of the p-type impurity are formed in regions corresponding to the outside of the first layer gate electrode 457. Simultaneously, low concentration impurity regions (p− regions) 485 are formed by through dope in regions in which only the first layer gate electrode 457 is exposed. Note that the same structure as the region of the p-channel TFT 502 is obtained in the region of the retaining capacitor 505. However, since this is a capacitor forming region, this structure is not a TFT structure (FIG. 9A).

Next, after the above resist patterns 479 to 481 are removed, a first interlayer insluting film 486 comprising a silicon oxynitride film having a thickness of 150 nm is deposited by a plasma CVD method. After that, in order to thermally activate the impurity elements (n-type impurity and p-type impurity) implanted into the semiconductor layers 403 to 407, thermal anneal processing is performed at 550° C. for 4 hours. In this embodiment, in order to reduce an off-current and improve a field effect mobility, Ni (nickel) as a crystallization catalyst for the semiconductor layers 403 to 407 is gettered by high concentration P (phosphorus) as the n-type impurity simultaneously with the thermal activation processing of the impurity elements. By this gettering processing, a reduction in a concentration of Ni (nickel) inside the semiconductor layers 403 to 407 is realized. The polycrystalline silicon TFT manufactured by this method has a high field effect mobility, and thus can indicate a preferable electrical characteristic such as the reduction of the off-current value. Note that the above thermal activation processing may be performed before the deposition of the first interlayer insulating film 486. However, in the case where a heat resistance of a wiring material for a gate electrode and the like is low, it is preferable that the processing is performed after the deposition of the first interlayer insulating film 486. After that, in order to terminate dangling bonds of the semiconductor layers 403 to 407, hydrogenation processing is performed at 410° C. for 1 hour in an atmosphere containing hydrogen at 3% (see FIG. 9B).

Next, a second interlayer insulating film 487 comprising an acrylic resin film having a thickness of 1.6 $\mu$m is formed on the first interlayer insulating film 486. After that, contact holes are formed in the second interlayer insulating film 487 by photolithography processing and dry etching processing. In this case, the contact holes are formed such that an electrode (first layer electrode 458 and second layer electrode 445) which functions as a source wiring is connected with the high concentration impurity regions 435, 437, 438, 482, and 484 (FIG. 10A).

Next, metal wirings 488 to 493 are formed for electrical connection with the high concentration impurity regions 435, 437, and 482 in the driver circuit 506. Simultaneously, connection electrodes 494, 496, and 497 and a gate wiring 495 in the pixel region 507 are formed. In this case, the metal wirings comprise a laminate film of a Ti film having a thickness of 50 nm and an Al—Ti alloy film having a thickness of 500 nm. The connection electrode 494 is formed to electrically connect the electrode (first layer electrode 458 and second layer electrode 445) which functions as the source wiring with pixel TFTs 504 through the impurity region 438. The connection electrode 496 is electrically connected with the impurity region 438 of the pixel TFTs 504 and the connection electrode 497 is electrically connected with the impurity region 484 of the retaining capacitor 505. The gate wiring 495 is formed to electrically connect among a plurality of gate electrodes (the first layer gate electrodes 456 and second layer gate electrodes 443) of the pixel TFTs 504. Next, after a transparent conductive film comprising ITO (indium tin oxide) or the like is deposited to have a thickness of 80 to 120 nm, a pixel electrode 498 are formed by photolithography processing and etching processing. The pixel electrode 498 is electrically connected with the impurity region 438 as the source region or the drain region of the pixel TFTs 504 through the connection electrode 496 and electrically connected with the impurity region 484 of the retaining capacitor 505 through the connection electrode 497 (see FIG. 10B).

By the above manufacturing process, an active matrix liquid crystal display comprising a GOLD structure polycrystalline silicon TFT having both Lov regions and Loff regions can be manufactured.

[Embodiment 2]

The present invention can be applied to various semiconductor display devices (active matrix liquid crystal display device, active matrix EL display device, and active matrix EC display device). Thus, the present invention can be applied to general electronic equipments in which the semiconductor display device is incorporated as a display medium.

As the electronic equipment, there are a video camera, a digital camera, a projector (rear type or front type), a head mounted display (goggle type display), a game machine, a car navigation system, a personal computer, personal digital assistants (mobile computer, mobile telephone, electronic book, and the like), and the like. Those concrete examples are shown in FIGS. 12A to 12F, 13A to 13D, and 14A to 14C.

Figure 12A:
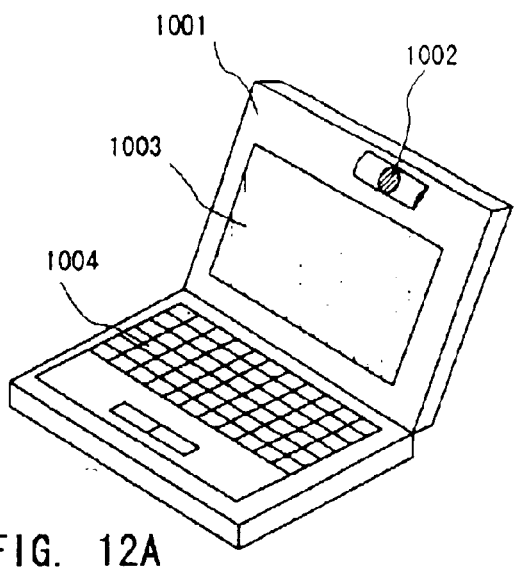
FIGS. 12A to 12F are schematic views of electronic equipments showing application examples (1) to the semiconductor display device.

FIG. 12A shows a personal computer which comprises a main body 1001, an image input portion 1002, a display device 1003, and a keyboard 1004. The present invention can be applied to the display device 1003 and another circuit.

Figure 12B:
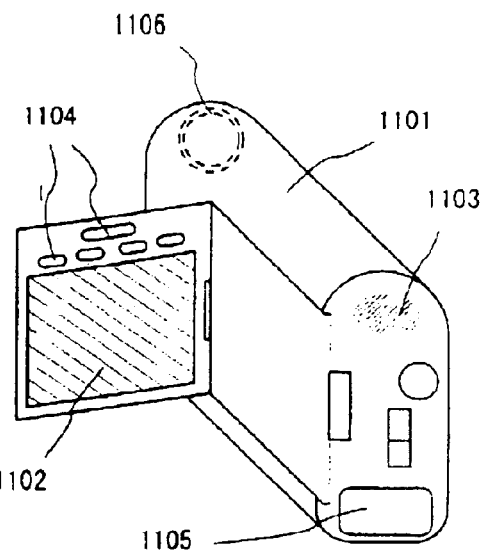

FIG. 12B shows a video camera which comprises a main body 1101, a display device 1102, an voice input portion 1103, an operational switch 1104, a battery 1105, and an image receiving portion 1106. The present invention can be applied to the display device 1102 and another circuit.

Figure 12C:
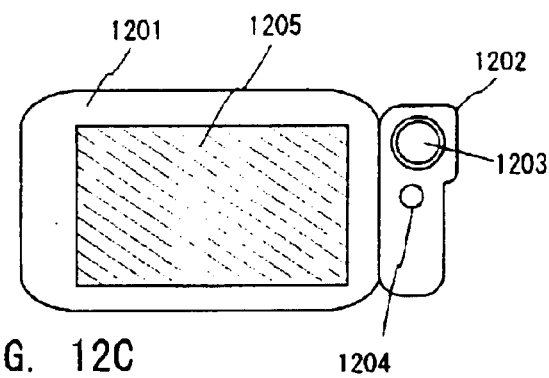

FIG. 12C shows a mobile computer which comprises a main body 1201, a camera portion 1202, an image receiving portion 1203, an operational switch 1204, and a display device 1205. The present invention can be applied to the display device 1205 and another circuit.

Figure 12D:
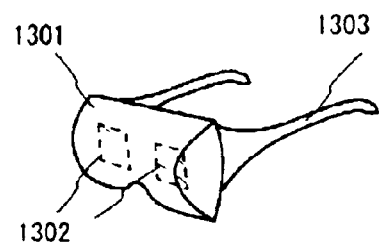

FIG. 12D shows a goggle type display which comprises a main body 1301, a display device 1302, and an arm portion 1303. The present invention can be applied to the display device 1302 and another circuit.

Figure 12E:
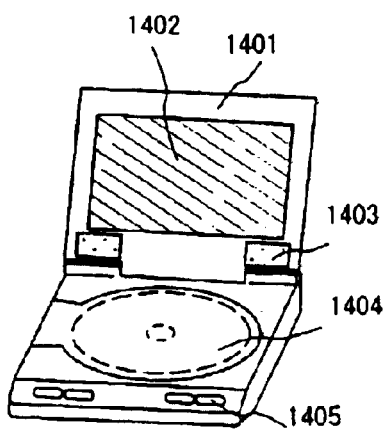

FIG. 12E shows a player used for a recording medium in which a program is recorded (hereinafter referred to as a recording medium) and the player comprising a main body 1401, a display device 1402, a speaker portion 1403, a recording medium 1404, and an operational switch 1405. Note that a DVD, a CD, or the like is used as the recording medium in this players, and the player can be utilized for music listening, game, or Internet. The present invention can be applied to the display device 1402 and another circuit.

Figure 12F:
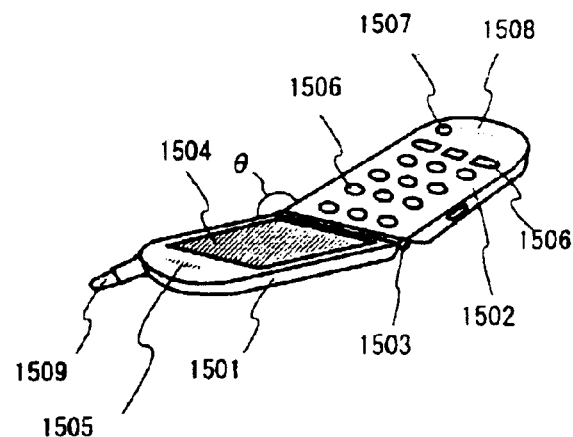

FIG. 12F shows a mobile telephone which comprises a display panel 1501, an operational panel 1502, a connection portion 1503, a display portion 1504, an sound output portion 1505, an operational key 1506, a power source switch 1507, a sound input portion 1508, and an antenna 1509. The display panel 1501 and the operational panel 1502 are connected with each other through the connection portion 1503. An angle θ formed by a surface on which the display portion 1504 of the display panel 1501 is located and a surface on which the operational key 1506 of the operational panel 1502 is located can be arbitrarily changed in the connection portion 1503. The present invention can be applied to the display portion 1504.

Figure 13A:
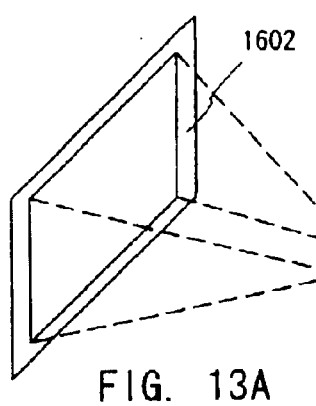
FIGS. 13A to 13D are schematic views of electronic equipments showing application examples (2) to the semiconductor display device.

FIG. 13A shows a front type projector which comprises a light source optical system and display device 1601 and a screen 1602. The present invention can be applied to the display device 1601 and another circuit.

Figure 13B:
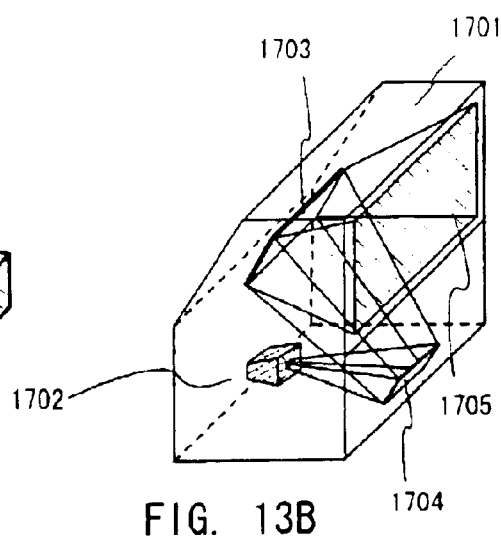

FIG. 13B shows a rear type projector which comprises a main body 1701, a light source optical system and display device 1702, mirrors 1703 and 1704, and a screen 1705. The present invention can be applied to the display device 1702 and another circuit.

Figure 13C:
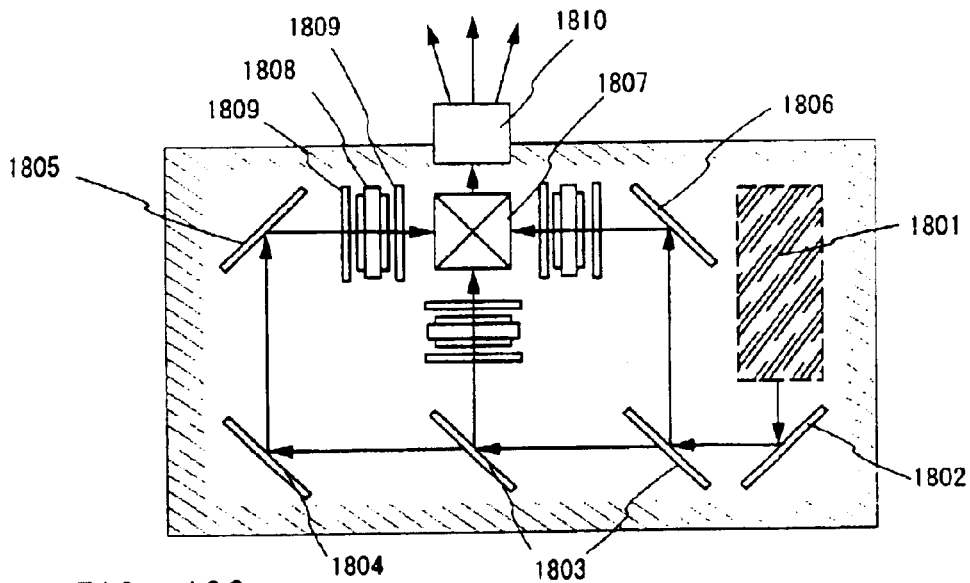

Note that FIG. 13C shows one example of a structure in the light source optical system and display device 1601 shown in FIG. 13A and the light source optical system and display device 1702 shown in FIG. 13B. Each of the light source optical system and display devices 1601 and 1702 comprises a light source optical system 1801, mirrors 1802 and 1804 to 1806, a dichroic mirror 1803, an optical system 1807, a display device 1808, a phase difference plate 1809, and a projecting optical system 1810. The projecting optical system 1810 comprises a plurality of optical lenses including a projection lens. This structure is called a three-plate type since three display devices 1808 are used. Also, in an optical path indicated by arrows in the drawing, an optical lens and a film having a polarization function, a film for adjusting a phase difference, an IR film, or the like may be suitably provided by an operator.

Figure 13D:
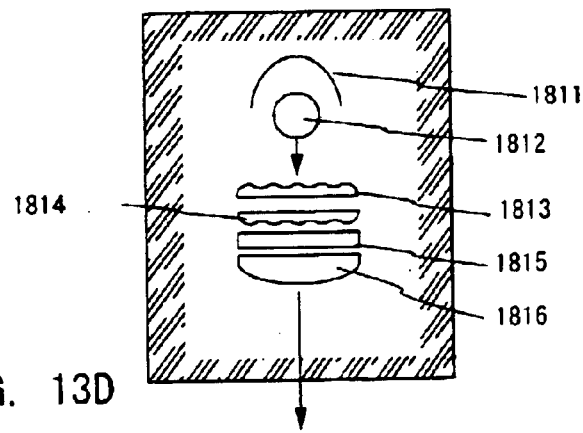

Also, FIG. 13D shows one example of a structure of the light source optical system 1801 shown in FIG. 13C. In this embodiment, the light source optical system 1801 comprises a reflector 1811, a light source 1812, lens arrays 1813 and 1814, a polarization conversion element 1815, and a condenser lens 1816. Note that the light source optical system shown in the drawing is one example and not limited to this structure. For example, an optical lens and a film having a polarization function, a film for adjusting a phase difference, an IR film, or the like may be suitably provided for the light source optical system by an operator.

Figure 14A:
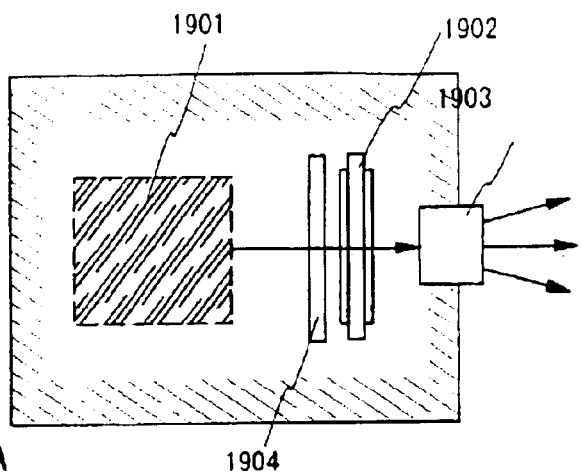
FIGS. 14A to 14C are schematic views of electronic equipments showing application examples (3) to the semiconductor display device.

Next, FIG. 14A shows an example of a single plate type. A light source optical system and display device shown in the drawing comprises a light source optical system 1901, a display device 1902, a projecting optical system 1903, and a phase difference plate 1940. The projecting optical system 1903 comprises a plurality of optical lenses including a projection lens. The light source optical system and display device shown in the drawing can be applied to the light source optical system and display devices 1601 and 1702 shown in FIGS. 13A and 13B. Also, the light source optical system shown in FIG. 13D may be used as the light source optical system 1901. Note that color filters (not shown) are provided in the display device 1902, and a display image is thus colored.

Figure 14B:
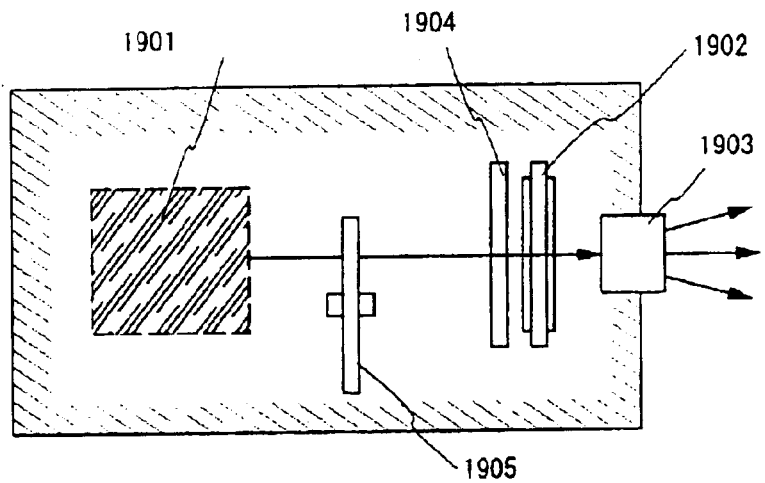

Also, a light source optical system and display device shown in FIG. 14B is an application example of that shown in FIG. 14A. Instead of providing color filters, a display image is colored using a rotatory RGB color filter circular plate 1905. The light source optical system and display device shown in the drawing can be applied to the light source optical system and display devices 1601 and 1702 shown in FIGS. 13A and 13B.

Figure 14C:
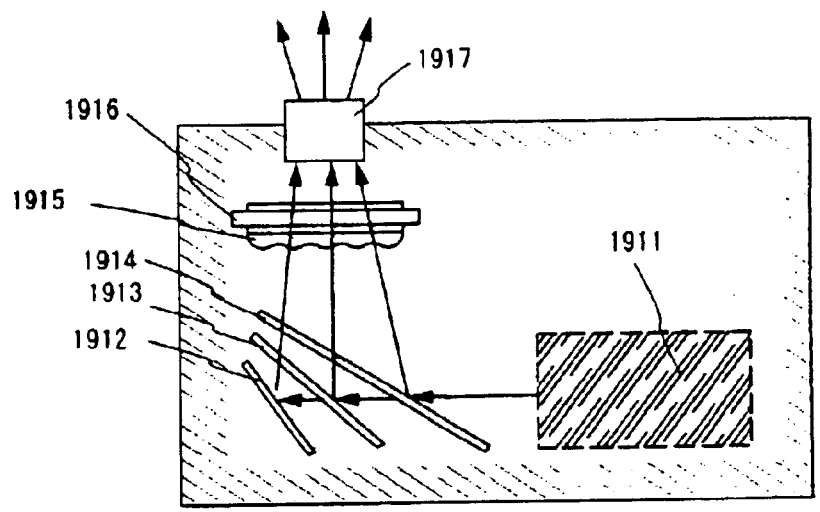
Figure 15A:
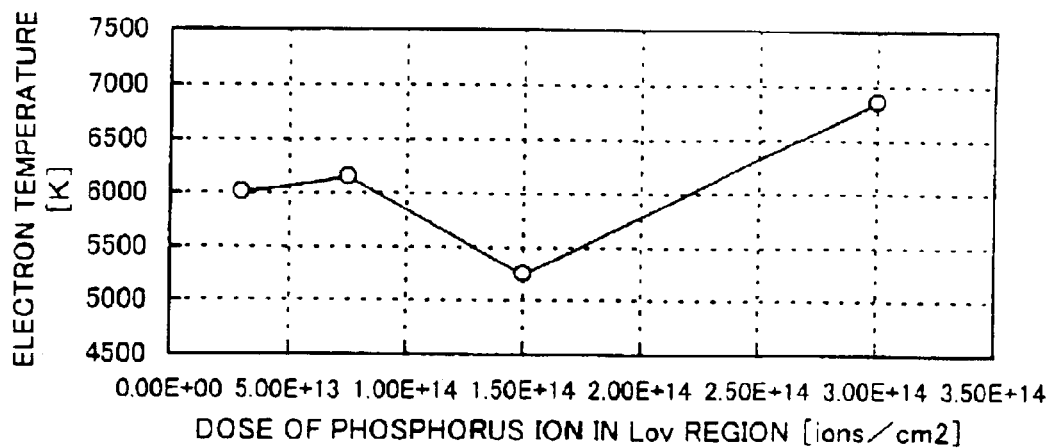
FIGS. 15A to 15C show simulation data of an n-channel GOLD structure polycrystalline silicon TFT.
Figure 15B:
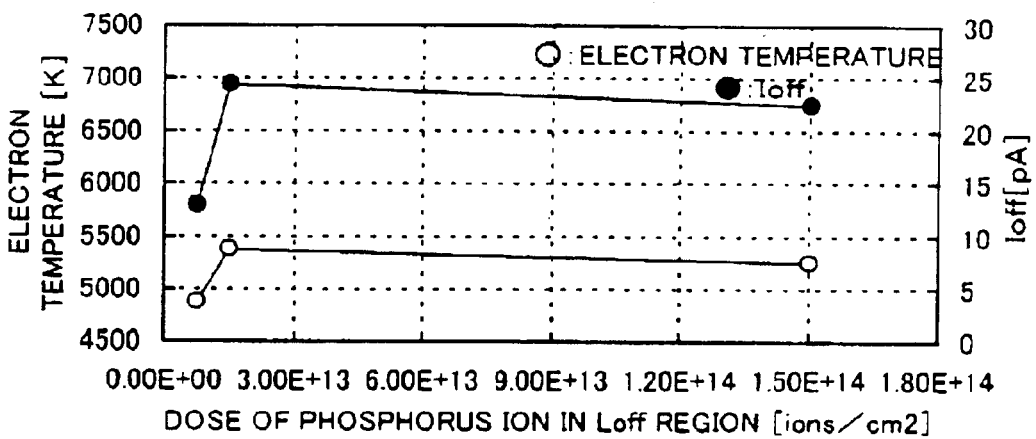
Figure 15C:
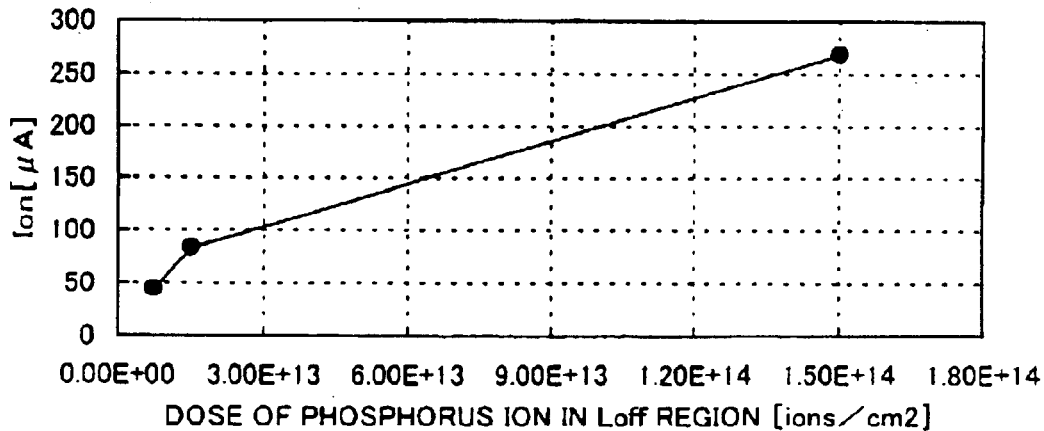

Also, a light source optical system and display device shown in FIG. 14C is called a color filterless single plate type. With respect to this type, a micro lens array 1915 is provided in a display device 1916 and a display image is colored using a dichroic mirror (green) 1912, a dichroic mirror (red) 1913, and a dichroic mirror (blue) 1914. A projecting optical system 1917 comprises a plurality of optical lenses including a projection lens. The light source optical system and display device shown in the drawing can be applied to the light source optical system and display devices 1601 and 1702 shown in FIGS. 13A and 13B. Also, an optical system using a coupling lens and a collimator lens in addition to a light source may be used as a light source optical system 1911.

As described above, an application area of the semiconductor display device comprising the GOLD structure polycrystalline silicon TFT having both Lov regions and Loff regions is extremely wide, and thus the present invention can be applied to electronic equipments of various fields, in which the semiconductor display device is incorporated.

According to the present invention, in the case where the GOLD structure polycrystalline silicon TFT having both the Lov regions and the Loff regions is formed, ion implantation into the Lov regions is independently performed using a negative resist pattern formed in a self alignment by the rear surface exposure method as a mask, and thus impurity concentrations of the Lov regions and the Loff regions can be independently controlled. Therefore, the following effects are obtained.

(Effect 1) When the impurity concentrations of the Lov regions and the Loff regions is controlled, since the GOLD structure polycrystalline silicon TFT can obtain both the hot carrier resistance and the off-current suppressing effect, the pixel region and the peripheral circuit in the semiconductor display device can be formed using the TFT having the same structure and it is effective to simplify a manufacturing process of the semiconductor display device.

(Effect 2) according to the present invention, since the simplification of the manufacturing process of the semiconductor display device can be realized, it is effective to improve a yield of the semiconductor display device and to reduce the costs thereof.

(Effect 3) Since the GOLD structure polycrystalline silicon TFT can obtain both the hot carrier resistance and the off-current suppressing effect, it is effective to improve a performance of the semiconductor display device.

What is claimed is:

1. A semiconductor device comprising a plurality of thin film transistors formed over a transparent insulating substrate, each of said thin film transistors comprising:

a semiconductor layer, a gate insulating film, and a gate electrode being laminated in order from a side near the transparent insulating substrate, and a source region and a drain region being formed in the semiconductor layer outside the gate electrode, wherein the gate electrode comprises a first layer gate electrode and a second layer gate electrode located over the first layer gate electrode wherein the first layer gate electrode extends beyond a side edge of the second layer gate electrode, wherein a first impurity region is formed in the semiconductor layer below the extending portion of the first layer gate electrode, wherein a second impurity region and the source region or the drain region are formed adjacent to each other from a side near the gate electrode in the semiconductor layer being the outside of a side edge of the first gate electrode, and wherein an impurity concentration of the first impurity region is higher than that of the second impurity region and lower than that of the source region or the drain region.

2. A device according to claim 1, wherein the first impurity region, the second impurity region, and the source region or the drain region are the same conductivity type impurity regions and have one of an n-type and a p-type as a conductivity type.

3. A device according to claim 1, wherein the first layer gate electrode and the second layer gate electrode comprise different high melting metals.

4. A device according to claim 1, wherein the first layer gate electrode comprises a TaN film as a compound containing high melting metal and the second layer gate electrode comprises a W film as the high melting metal.

5. A device according to claim 1, wherein the semiconductor layer comprises one of a polycrystalline silicon film and a crystalline silicon film formed using a catalyst element.

6. An electronic equipment having a device according to claim 1, wherein the electronic equipment is selected from the group consisting of a video camera, a digital camera, a rear type projector, a front type projector, a head mounted display, a goggle type display, a game machine, a car navigation system, a personal computer, a mobile computer, a mobile telephone, an electronic book, a personal computer, and a recording medium.

7. A semiconductor device comprising a plurality of n-channel thin film transistors formed over a transparent insulating substrate, each of the n-channel thin film transistors comprising:

a semiconductor layer, a gate insulating film, and a gate electrode being laminated in order from a side near the transparent insulating substrate, and a source region and a drain region being formed in the semiconductor layer outside the gate electrode, wherein the gate electrode comprises a first layer gate electrode and a second layer gate electrode located over the first layer gate electrode wherein the first layer gate electrode extends beyond a side edge of the second layer gate electrode, wherein a first impurity region is formed in the semiconductor layer below the extending portion of the first layer gate electrode, wherein a second impurity region and the source region or the drain region are formed adjacent to each other from a side near the gate electrode in the semiconductor layer being the outside of a side edge of the first gate electrode, and wherein an impurity concentration of the first impurity region is higher than that of the second impurity region and lower than that of the source region or the drain region.

8. A device according to claim 7, wherein the first impurity region, the second impurity region, and the source region or the drain region are n-type impurity regions.

9. A device according to claim 7, wherein an n-type impurity concentration of the first impurity region is $2 \times 10^{16}$ to $2.7 \times 10^{19}$ atoms/cm$^3$, preferably, about $1 \times 10^{17}$ to $5.3 \times 10^{18}$ atoms/cm$^3$.

10. A device according to claim 7, wherein an n-type impurity concentration of the second impurity region is $4.7 \times 10^{15}$ to $2.7 \times 10^{18}$ atoms/cm$^3$, preferably, about $4.7 \times 10^{17}$ to $5.3 \times 10^{17}$ atoms/cm$^3$.

11. A device according to claim 7, wherein an n-type impurity concentration of the source region or the drain region is about $3 \times 10^{18}$ to $5 \times 10^{21}$ atoms/cm$^3$, preferably, about $1.7 \times 10^{19}$ to $2.7 \times 10^{20}$ atoms/cm$^3$.

12. A device according to claim 7, wherein the first layer gate electrode and the second layer gate electrode comprise different high melting metals.

13. A device according to claim 7, wherein the first layer gate electrode comprises a TaN film as a compound containing high melting metal and the second layer gate electrode comprises a W film as the high melting metal.

14. A device according to claim 7, wherein the semiconductor layer comprises one of a polycrystalline silicon film and a crystalline silicon film formed using a catalyst element.

15. An electronic equipment having a device according to claim 7, wherein the electronic equipment is selected from the group consisting of a video camera, a digital camera, a rear type projector, a front type projector, a head mounted display, a goggle type display, a game machine, a car navigation system, a personal computer, a mobile computer, a mobile telephone, an electronic book, a personal computer, and a recording medium.

16. A semiconductor device comprising:

a substrate;

a semiconductor layer formed over the substrate;

a gate insulating film formed over the semiconductor layer;

a gate electrode formed over the semiconductor layer with the gate insulating film interposed therebetween, said gate electrode including a first conductive layer and a second conductive layer formed on the first conductive layer wherein the first conductive layer extends beyond side edges of the second conductive layer;

a pair of first impurity regions formed in the semiconductor layer below the extending portions of the first conductive layer;

a channel region formed in the semiconductor layer between the pair of first impurity regions;

source and drain regions formed in the semiconductor layer;

a pair of second impurity regions formed in the semiconductor layer between the pair of first impurity regions and the source and drain regions, wherein an impurity concentration of the first impurity region is higher than that of the second impurity region and lower than that of the source and drain regions.

17. A device according to claim 16, wherein the substrate is transparent.

18. A device according to claim 16, wherein the first impurity region, the second impurity region, and the source and drain regions are the same conductivity type impurity regions and have one of an n-type and a p-type as a conductivity type.

19. A device according to claim 16, wherein the first layer gate electrode and the second layer gate electrode comprise different high melting metals.

20. A device according to claim 16, wherein the first conductive layer comprises a TaN film as a compound containing high melting metal and the second layer gate electrode comprises a W film as the high melting metal.

21. A device according to claim 16, wherein the semiconductor layer comprises one of a polycrystalline silicon film and a crystalline silicon film formed using a catalyst element.

22. An electronic equipment having a device according to claim 16, wherein the electronic equipment is selected from the group consisting of a video camera, a digital camera, a rear type projector, a front type projector, a head mounted display, a goggle type display, a game machine, a car navigation system, a personal computer, a mobile computer, a mobile telephone, an electronic book, a personal computer, and a recording medium.

* * * * *